(12) United States Patent
Tanaka et al.

(10) Patent No.: US 12,142,621 B2
(45) Date of Patent: Nov. 12, 2024

(54) METHOD OF MANUFACTURING CONNECTION STRUCTURE, CONNECTION STRUCTURE, FILM STRUCTURE, AND METHOD OF MANUFACTURING FILM STRUCTURE

(71) Applicant: DEXERIALS CORPORATION, Shimotsuke (JP)

(72) Inventors: Yusuke Tanaka, Tochigi (JP); Yusuke Kamata, Tochigi (JP); Hidetsugu Namiki, Tochigi (JP); Manabu Suzuki, Tochigi (JP)

(73) Assignee: DEXERIALS CORPORATION, Shimotsuke (JP)

(*) Notice: Subject to any disclaimer, the term of this patent is extended or adjusted under 35 U.S.C. 154(b) by 473 days.

(21) Appl. No.: 17/437,350

(22) PCT Filed: Mar. 2, 2020

(86) PCT No.: PCT/JP2020/008778
§ 371 (c)(1),
(2) Date: Sep. 8, 2021

(87) PCT Pub. No.: WO2020/184267
PCT Pub. Date: Sep. 17, 2020

(65) Prior Publication Data
US 2022/0181369 A1   Jun. 9, 2022

(30) Foreign Application Priority Data

Mar. 8, 2019  (JP) .................. 2019-043203
May 29, 2019  (JP) .................. 2019-100787
Mar. 2, 2020  (JP) .................. 2020-035390

(51) Int. Cl.
H01L 27/146  (2006.01)
H01L 23/00  (2006.01)

(52) U.S. Cl.
CPC ........ *H01L 27/14618* (2013.01); *H01L 24/00* (2013.01); *H01L 24/80* (2013.01); *H01L 27/14683* (2013.01); *H01L 2924/00* (2013.01)

(58) Field of Classification Search
CPC ... H01L 27/14618; H01L 24/00; H01L 24/80; H01L 27/14683
See application file for complete search history.

(56) References Cited

U.S. PATENT DOCUMENTS 9,748,293 B1 * 8/2017 Li ................... H04N 23/57
10,373,992 B1 * 8/2019 Hsu ................. G02B 7/022
(Continued)

FOREIGN PATENT DOCUMENTS

CN   101309988 A   11/2008
CN   102738088 A   10/2012
(Continued)

OTHER PUBLICATIONS

Sep. 6, 2023 Office Action issued in Taiwanese Patent Application No. 109107238.
(Continued)

*Primary Examiner* — Nathan W Ha
(74) *Attorney, Agent, or Firm* — Oliff PLC

(57) ABSTRACT

A method of manufacturing a connection structure, connection structure, film structure, and a method of manufacturing a film structure capable of mounting an electronic component having a plurality of terminal rows on a mounting surface by using existing equipment, including: a pasting step of pasting, from a film structure including a tape-shaped base material and a connection film formed thereon, connection films having a unit region of a predetermined length in the length direction of the base material and a predetermined width in the width direction to a first or second electronic component having a plurality of terminal rows;
(Continued)

and a connecting step of connecting terminals of the first and second electronic components through the connection films, wherein the film structure includes, in the unit region, in addition to portions corresponding to the plurality of terminal rows, a non-pasting portion in which the connection film is not pasted.

25 Claims, 13 Drawing Sheets

(56) References Cited

U.S. PATENT DOCUMENTS

| | | | | |
|---|---|---|---|---|
| 10,490,589 B1* | 11/2019 | Liu | H01L 27/14687 |
| 2006/0006486 A1* | 1/2006 | Seo | H04N 23/54 257/E31.118 |
| 2009/0186552 A1* | 7/2009 | Shinya | G02F 1/133502 445/58 |
| 2010/0043965 A1* | 2/2010 | Kamiya | G02F 1/133308 156/275.5 |
| 2010/0097746 A1* | 4/2010 | Toyoda | G02B 1/14 361/679.01 |
| 2010/0118245 A1* | 5/2010 | Toyoda | G02F 1/1333 252/582 |
| 2010/0134713 A1* | 6/2010 | Toyoda | G02F 1/1333 349/122 |
| 2011/0068476 A1* | 3/2011 | Kawasaki | H01L 27/14683 257/E21.546 |
| 2012/0105713 A1* | 5/2012 | Luan | H04N 23/57 348/374 |
| 2012/0211852 A1* | 8/2012 | Iwafuchi | H01L 27/14649 257/435 |
| 2012/0257075 A1* | 10/2012 | Kamada | H01L 27/14618 257/E31.127 |
| 2013/0026591 A1* | 1/2013 | Iwafuchi | H01L 27/14621 257/E31.127 |
| 2014/0124887 A1* | 5/2014 | Jan | H04N 23/55 257/432 |
| 2015/0289365 A1* | 10/2015 | Hunat | H01L 23/552 257/459 |
| 2016/0104737 A1* | 4/2016 | Luan | H01L 27/14636 257/432 |
| 2016/0104738 A1* | 4/2016 | Luan | H01L 27/14625 257/432 |
| 2016/0306265 A1* | 10/2016 | Riel | G02B 7/003 |
| 2017/0110416 A1* | 4/2017 | Miao | G06V 40/1329 |
| 2017/0256471 A1* | 9/2017 | Fang | H01L 27/14632 |
| 2017/0264800 A1* | 9/2017 | Wang | H01L 27/14618 |
| 2017/0271390 A1* | 9/2017 | Wang | H04N 23/51 |
| 2017/0280558 A1* | 9/2017 | Ohara | G03B 17/55 |
| 2017/0353646 A1* | 12/2017 | Wang | H01L 27/14627 |
| 2018/0013939 A1* | 1/2018 | Shigemitsu | G03B 17/02 |
| 2018/0277583 A1* | 9/2018 | Harazono | H01L 23/02 |
| 2019/0013346 A1* | 1/2019 | Tseng | H01L 27/14687 |
| 2019/0019737 A1* | 1/2019 | Hogyoku | H01L 23/15 |
| 2019/0035836 A1* | 1/2019 | Watanabe | H01L 24/85 |
| 2019/0036297 A1* | 1/2019 | Gloor | H01S 5/423 |
| 2019/0074310 A1* | 3/2019 | Chuang | H01L 27/14634 |
| 2019/0088699 A1* | 3/2019 | Shen | H01L 24/48 |
| 2019/0096944 A1* | 3/2019 | Okada | H01L 27/14636 |
| 2019/0104236 A1* | 4/2019 | Iwafuchi | H01L 27/14621 |
| 2019/0141224 A1* | 5/2019 | Park | H04N 23/54 |
| 2019/0148429 A1* | 5/2019 | Wang | H05K 1/0274 348/294 |
| 2019/0355639 A1* | 11/2019 | Chen | H01L 27/14625 |
| 2019/0371833 A1* | 12/2019 | Hogyoku | H01L 27/14601 |
| 2019/0387623 A1* | 12/2019 | Itotani | H05K 1/18 |
| 2019/0394366 A1* | 12/2019 | Li | H01L 27/14625 |
| 2020/0043965 A1* | 2/2020 | Otani | H01L 27/14625 |
| 2020/0083270 A1* | 3/2020 | Yamamoto | H04N 23/53 |
| 2020/0098810 A1* | 3/2020 | Kimura | H01L 23/3114 |
| 2020/0162648 A1* | 5/2020 | Wang | G02B 7/021 |
| 2020/0176496 A1* | 6/2020 | Kimura | H04N 23/54 |
| 2020/0185350 A1* | 6/2020 | Jin | H01L 24/33 |
| 2020/0205282 A1* | 6/2020 | Chen | H01L 27/14685 |
| 2020/0212096 A1* | 7/2020 | Nagai | H01L 27/14623 |
| 2020/0279880 A1* | 9/2020 | Zhang | H01L 27/14618 |
| 2020/0283551 A1* | 9/2020 | Arai | C09J 11/06 |
| 2020/0303448 A1* | 9/2020 | Wang | H01L 31/1876 |
| 2020/0311376 A1* | 10/2020 | Kim | G06V 40/1318 |
| 2020/0402873 A1* | 12/2020 | Kohama | H01L 23/49822 |
| 2020/0403017 A1* | 12/2020 | Wang | H01L 31/0203 |
| 2021/0057476 A1* | 2/2021 | Kaneguchi | H01L 27/14632 |
| 2021/0090964 A1* | 3/2021 | Atago | H04N 25/00 |
| 2021/0111213 A1* | 4/2021 | Ooki | H01L 27/14618 |
| 2021/0167105 A1* | 6/2021 | Wang | H01L 27/14627 |
| 2021/0306530 A1* | 9/2021 | Wang | H05K 1/0274 |
| 2022/0223315 A1* | 7/2022 | Tanaka | H01B 1/22 |
| 2023/0094421 A1* | 3/2023 | Matsumura | B41J 2/16544 347/33 |

FOREIGN PATENT DOCUMENTS

| | | |
|---|---|---|
| CN | 103457569 A | 12/2013 |
| CN | 104601136 A | 5/2015 |
| JP | S60-127334 U | 8/1985 |
| JP | S61-111943 U | 7/1986 |
| JP | H05-27034 U | 4/1993 |
| JP | H09-111196 A | 4/1997 |
| JP | 2006-16572 A | 1/2006 |
| JP | 2012-182442 A | 9/2012 |
| JP | 2015-130426 A | 7/2015 |
| KR | 10-2006-0017953 A | 2/2006 |
| WO | 2007/058108 A1 | 5/2007 |
| WO | 2014/007116 A1 | 1/2014 |

OTHER PUBLICATIONS

Dec. 5, 2022, Request for the Submission of an Opinion issued in Korean Patent Application No. 10-2021-7028421.

Jun. 2, 2020 International Search Report issued in International Patent Application No. PCT/JP2020/008778.

Mar. 26, 2024 Office Action issued in Japanese Patent Application No. 2020-035390.

Jul. 18, 2024 Office Action issued in Chinese Patent Application No. 202080018731.2.

Aug. 21, 2024 Office Action issued in Japanese Patent Application No. 2020-035390.

* cited by examiner

METHOD OF MANUFACTURING CONNECTION STRUCTURE, CONNECTION STRUCTURE, FILM STRUCTURE, AND METHOD OF MANUFACTURING FILM STRUCTURE

TECHNICAL FIELD

The present technology relates to a method of manufacturing a connection structure in which electronic components are connected, a connection structure, a film structure, and a method of manufacturing a film structure. This application claims priority based on Japanese Patent Application Serial No. 2019-043203 filed on Mar. 8, 2019 and Japanese Patent Application Serial No. 2019-100787 filed on May 29, 2019 in Japan, which are incorporated herein by reference.

BACKGROUND ART

Conventionally, ACF (anisotropic conductive film) and NCF (non-conductive film), among others, are known as connection films for connecting various electronic components, and these connection films are used, for example, to mount a camera module (see, for example, Patent Document 1).

PRIOR ART REFERENCE

Patent Reference

Patent Document 1: Japanese Unexamined Patent Application Publication No. 2015-130426

SUMMARY OF THE INVENTION

Problem to be Solved by the Invention

In recent years, there has been known an electronic component having a concave portion in a central portion of a mounting surface. For example, in a camera module, in order to accommodate an image sensor, a central portion of a ceramic substrate is cut out to form a concave portion in a central portion of a mounting surface, and a terminal row is formed on a peripheral portion of the mounting surface. Further, electronic components having a plurality of terminal rows on the mounting surface or electronic components having a plurality of convex portions on the mounting surface and terminal rows formed on the convex portions can be regarded as those having a concave portion.

When an electronic component having a plurality of terminal rows on such a mounting surface is mounted using a connection film, a large improvement in mounting equipment is required. For example, in the case of pasting connection films to each of the plurality of terminal rows on the mounting surface, it is necessary to paste the connection film a plurality of times. In addition, in the case of pasting a connection film to the entire surface of an electronic component mounting surface having a concave portion in a central portion of the mounting surface, there is a concern that the concave portion might be filled with gas to reduce the reliability of the connection.

The present technology has been proposed in view of such conventional circumstances, and provides a method of manufacturing a connection structure, a connection structure, a film structure, and a method of manufacturing a film structure capable of mounting an electronic component having a plurality of terminal rows on a mounting surface by using existing equipment.

Means of Solving the Problem

A method of manufacturing a connection structure according to the present technology includes: a pasting step of pasting, from a film structure comprising a tape-shaped base material and a connection film formed on the base material, a connection film having a unit region of a predetermined length in the length direction of the base material and a predetermined width in the width direction of the base material to a first electronic component or a second electronic component having a plurality of terminal rows; and a connecting step of connecting terminals of the first electronic component and terminals of the second electronic component through the connection film, wherein the film structure includes, in the unit region, in addition to portions corresponding to the plurality of terminal rows, a non-pasting portion in which the connection film is not pasted.

A connection structure according to the present technology includes: a first electronic component having a plurality of terminal rows; a second electronic component; and a cured film provided between the first electronic component and the second electronic component and formed by curing a connection film including, in a unit region having a predetermined length and a predetermined width in plan view, a void portion in addition to portions corresponding to the plurality of terminal rows, wherein terminals of the first electronic component and terminals of the second electronic component are connected.

A film structure according to the present technology includes: a tape-shaped base material; and a connection film formed on the base material, wherein the connection film further includes a unit region of a predetermined length in the length direction of the base material and a predetermined width in the width direction of the base material in plan view and a non-pasting portion in a direction from a peripheral edge portion of the unit region to a central portion of the unit region.

A method of manufacturing a film structure according to the present technology includes: a processing step of processing a film stock comprising a tape-shaped base material and a connection film formed on the base material, wherein the processing step includes forming a film structure which has a unit region of a predetermined length in the length direction of the base material and a predetermined width in the width direction of the base material in plan view and has a non-pasting portion in a direction from a peripheral edge portion of the unit region to a central portion of the unit region.

Effects of the Invention

According to the present technology, since the connection film includes, in the unit region, a non-pasting portion in which the connection film is not pasted in addition to portions corresponding to the plurality of terminal rows, an electronic component having a plurality of terminal rows on a mounting surface can be mounted using existing mounting equipment.

MODE FOR CARRYING OUT THE INVENTION

Figure 1:
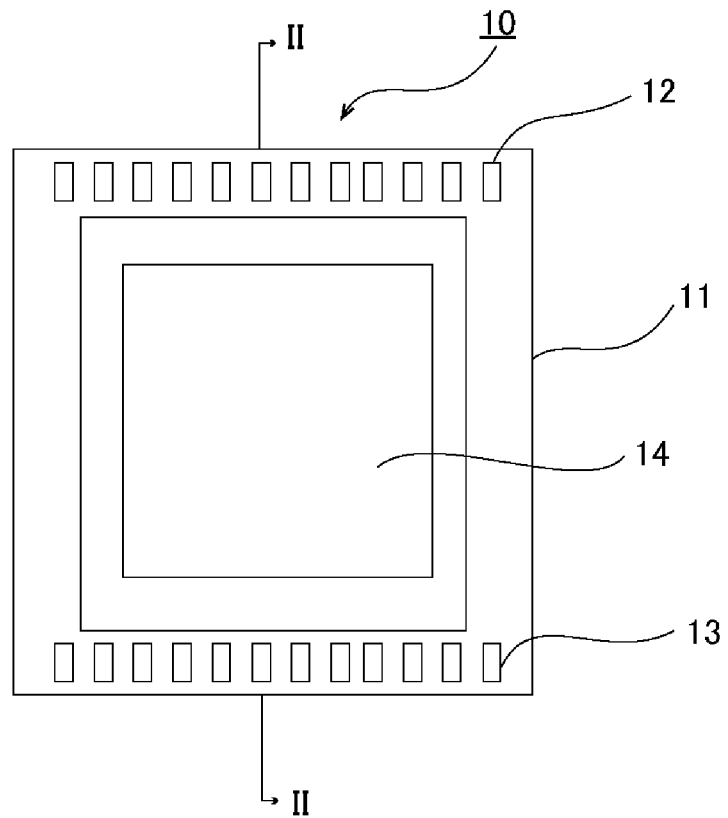
FIG. 1 is a plan view illustrating a mounting surface of a camera module.

Embodiments of the present invention will now be described in detail in the following order with reference to the drawings.
1. Manufacturing method of connection structure
2. Connection structure
3. Film structure
4. Method of manufacturing film structure
5. Modified Examples
6. Examples

1. Method of Manufacturing Connection Structure

The method of manufacturing a connection structure according to the present embodiment includes: a pasting step of pasting, from a film structure comprising a tape-shaped base material and a connection film formed on the base material, a connection film having a unit region of a predetermined length in the length direction of the base material and a predetermined width in the width direction of the base material to a first electronic component or a second electronic component having a plurality of terminal rows; and a connecting step of connecting terminals of the first electronic component and terminals of the second electronic component through the connection film, wherein the film structure includes, in the unit region, in addition to portions corresponding to the plurality of terminal rows, a non-pasting portion in which the connection film is not pasted. Thus, existing mounting equipment can be used to mount an electronic component having a plurality of terminal rows on a mounting surface. Further, in the pasting step, the connection film can be collectively pasted without pasting the connection film a plurality of times to each of the plurality of terminal rows.

Here, the "unit region" indicates a region having a predetermined length in the length direction of the base material, and is, for example, a rectangular region. Further, the "non-pasting portion" indicates a region where the connection film is not pasted to the electronic component in the unit region, and includes, for example, a void where the connection film does not exist and a connection film which is not pasted by a cutting process.

Examples of the first electronic component include those in which the mounting surface comprises a plurality of convexes and terminal rows provided on the convexes, those in which a plurality of terminal rows are provided on a flat mounting surface, and those in which a central portion of the mounting surface has a concave portion and terminal rows are provided on the peripheral portion of the mounting surface. An example of the first electronic component having a concave portion in a central portion of a mounting surface has, for example, a rectangular mounting surface, and the mounting surface has terminal rows on two opposing sides of the peripheral edge of the concave portion, two adjacent sides (L-shape) of the concave portion, or three sides (rectangular U-shape, curved U-shape, or C-shape) of the peripheral edge of the concave portion. The terminal rows may be located on the entire periphery of the peripheral edge. The peripheral edges of the concave portion and the terminal rows may be formed only in parallel or perpendicular, but the present invention is not limited to this, and they are appropriately adjusted according to the object. Thus, the shape of the unit region of the connection film may be appropriately adjusted accordingly.

The outer shape of the mounting surface may be not only a rectangular shape but also a curved shape, a circular shape, and a polygonal shape, among other shapes. Further, the outer shape of the mounting surface may be composed of sides as described above, or may have a shape in which the inner portion is removed (punched out). In addition, the shape of the mounting component having the mounting surface may or may not be the same as that of the mounting surface. This can apply to either of the first electronic component and the second electronic component, or both (not shown).

When the first electronic component has a concave portion in a central portion of the mounting surface, the film structure preferably has a non-pasting portion in a direction from a peripheral edge of the unit region to a central portion of the unit region. As a result, it is possible to prevent gas from filling the concave portion to reduce the reliability of the connection.

When the unit region of the film structure is rectangular, it is preferable that the non-pasting portion is formed in a direction from a middle portion of at least one side of the unit region to a central portion of the unit region. This makes it possible to mount the first electronic component having a mounting surface on which terminal rows are formed on three sides (rectangular U-shaped) of the peripheral edge of the concave portion.

In addition, when the unit region of the film structure is rectangular, it is preferable that the non-pasting portion in the unit region is formed from a middle portion in the width direction of the base material and extended in the length direction of the base material. This makes it possible to mount the first electronic component having a mounting surface having terminal rows formed on two opposite sides of the peripheral edge of the concave portion.

Further, in the unit region of the film structure, the connection film may be linearly processed to form a pasting portion in a polygonal shape such as a hexagon, an octagon, a dodecagon, and rectangular U-shape, or may be formed as a curved shape such as a curved U-shape, a C-shape, or a cylindrical shape. The pasting portion of the connection film may have a shape in which straight lines and curved lines are mixed. The polygonal shape may be a regular polygon. The corners of these shapes may be chamfered. Further, the pasting portion of the connection film may have a shape in which a part of the pasting portion is removed. For example, a rectangular corner portion may be removed to form the pasting portion of the connection film into a cross shape or a similar shape. For example, when the unit region of the film structure is rectangular, the corner portion of the rectangular connection film may be chamfered with a straight line to form a non-pasting portion, thereby forming an octagonal pasting portion. Each corner of the square or rectangular connection film may be chamfered linearly to form an octagon, or the corners of the square or rectangular connection film may be removed to form a cross shape. Thus, the connection film can be implemented in an octagon or cross shape. The chamfering process and the removing process are not limited to a shape formed with straight lines, but may be a shape formed with curved lines or a shape in which straight lines and curved lines are mixed. The connection film of an octagon or cross shape is just an example, and only a part of the connection film may be chamfered or removed. The connection film may have a shape in which a part of the inner portion is removed (punched out). The shape of the connection film is not limited to a shape formed with straight lines as described above, and may be a shape formed with curved lines or a shape in which straight lines and curved lines are mixed. In this case, as the film structure, only the connection film may be removed, or the connection film and the base material may be removed. Thus, when the connection film is used for connection, it is possible to prevent the resin protrusion at the corners of the mounting surface from largely occupying the side surfaces of the mounting components. In addition, when assembled together with another component, unnecessary contact of resin with the other component is easily avoided, which contributes to prevention of contamination. In particular, the more precise and compact, the more preferable to have a shape formed by chamfering or removing (punching out).

In the unit region of the film structure, at least a part of the pasting portion is preferable to have the same shape as the shape of the mounting surface of the first electronic component or the second electronic component. In other words, the pasting portion of the connection film may be, for example, a rectangular shape, a curved shape, a circular shape, a polygonal shape, or the like in accordance with the shape of the mounting surface, and may be a rectangular U-shape, a curved U-shape, a C-shape, or the like in which a part of the former shapes is missing. Further, the pasting portion of the connection film may have a punched out shape formed by removing an inner portion of the surface. By matching the shape of the pasting portion of the connection film to the outer shape of the mounting surface, it is possible to prevent a part of the connection film from excessively protruding from the mounting surface, and therefore, it is possible to improve the workability by facilitating the handling of the electronic component to be mounted, prevent the hindrance to the preceding and subsequent processes, and as a result, reduce the overall manufacturing cost. For example, in the step of bonding (temporary bonding) the connection film to the substrate in the connection process, since the outer shape of the substrate and the connection film are close to each other, an effect of improving workability can be expected.

Further, in the unit region of the film structure, the size of the outer peripheral edge of the pasting portion may be smaller than, the same as, or larger than the size of the outer peripheral edge of the mounting surface of the first electronic component or the second electronic component. In consideration of the suppression of excessive protrusion of the adhesive film, the lower limit of the size of the outer peripheral edge of the pasting portion relative to the size of the outer peripheral edge of the mounting surface is preferably 50% or more, and more preferably 80% or more. Furthermore, if the size of the outer peripheral edge of the mounting surface is too small, there is no margin for stable pasting when mounting is continuously performed; therefore, since it is desirable to make a margin for stable pasting, the upper limit relative to the size of the outer peripheral edge of the mounting surface is preferably 110% or less, more preferably 105% or less, and still more preferably 100% or less. It is necessary to provide the connection film so as to sufficiently cover the terminals on the mounting surface, and the connection film can be appropriately adjusted according to the width and shape of the mounting surface. The size of the pasting portion may be adjusted in consideration of the effective connection area and the influence of the protrusion. Although it is preferable that the outer peripheral edge of the pasting portion and the shape of the mounting surface of the first electronic component or the second electronic component are identical or similar, even if there is a partial difference, such a case is not excluded from the scope of the present technology.

The film structure preferably has a non-pasting portion in a central portion in the unit region. This corresponds to the connection film having the aforementioned rectangular U-shaped, curved U-shaped, and C-shaped pasting portions. In addition, the non-pasting portion may have a punched out shape formed by removing an inner portion of the surface. That is, in the film structure, the pasting portion has an outer peripheral edge and an inner peripheral edge in the unit region. A sufficient effective connection area is required to be exist between the outer peripheral edge and the inner peripheral edge of the pasting portion of the connection film.

This can prevent unnecessary and excessive protrusion of the connection film and filling of gas when the electronic component having a concave portion in the mounting surface is mounted. It should be noted that the non-pasting portion may be a slit or a hole. The rectangular U-shape, the curved U-shape, and the C-shape do not necessarily have to be continuous. The non-pasting portion have a punched out shape formed by removing an inner portion with all of the sides forming the outer shape being continuous. A film structure may be formed by providing a pasting portion on a base material such that portions corresponding to the sides constituting these shapes are separated from each other. The step of temporarily pasting the connection film and the step of connecting the components may be performed collectively to improve the workability or may be performed side by side to reduce the modification of the equipment, thereby reducing the installation cost. It should be noted that since a connection film (pasting portion) for such a side is disposed on the base material, the film winding body from which the film is drawn out can be only one, and it is expected that modification of existing manufacturing equipment will be relatively small. The same effect can be expected even in the case of a punched out shape in which all the sides forming the outer shape are connected. These may be appropriately selected according to conditions such as restrictions on equipment modification for temporary bonding or pressure bonding of the connection film.

The first electronic component and the second electronic component are not particularly limited and can be appropriately selected according to the purpose. Examples of the first electronic component include a ceramic substrate, a rigid substrate, a flexible printed circuit (FPC), a glass substrate, a plastic substrate, a resin multilayer substrate, an IC (integrated circuit) module, and an IC chip, among others. Examples of the second electronic component include a ceramic substrate, a rigid substrate, a flexible printed circuit (FPC), a glass substrate, a plastic substrate, and a resin multilayer substrate, among others.

In a functional module such as a camera module, a ceramic substrate is sometimes used from the viewpoint of excellent electrical insulation and thermal insulation. The ceramic substrate has advantages such as excellent dimensional stability in miniaturized implementation (for example, 1 cm$^2$ or less).

The connection film is not particularly limited, and examples thereof include a film-shaped anisotropic conductive film (ACF) and a film-shaped adhesive non-conductive film (NCF). The curing type of the connection film is not particularly limited, and examples thereof include a thermosetting type, a photo-curing type, and a photo-thermosetting type. The connection film may be a hot melt type using a thermoplastic resin. The connection film according to the present technology is provided on a base material (base material film) and can be separated from a release film. This is different from the one where a pressure sensitive adhesive or a curable resin on a base material is used as a whole (without separation). Therefore, a high level of processing technology is required for the connection film.

It should be noted that the present technology can be used, for example, in a method of manufacturing any electronic device using electrical connections, such as a semiconductor device (including, in addition to driver ICs, all devices using semiconductor such as optical elements, thermoelectric conversion elements, and photoelectric conversion elements), a display device (monitors, television receivers, and head-mounted displays, among others), a portable device (tablets, smartphones, and wearable terminals, among others), a game console, an audio device, an imaging device (one using an image sensor such as a camera module), an electric device to be mounted on a vehicle (mobility device), a medical device, a sensor device (touch sensor, fingerprint authentication, and iris authentication, among others), and a household appliance.

In the following, a method of manufacturing a connection structure for mounting a camera module will be described as a specific example. The method of manufacturing a connection structure shown as a specific example includes a pasting step of pasting a connection film to a camera module, a mounting step of mounting a flexible substrate onto the camera module, and a connecting step of connecting terminals of the camera module and terminals of the flexible substrate via the connection film.

Camera Module

Figure 2:
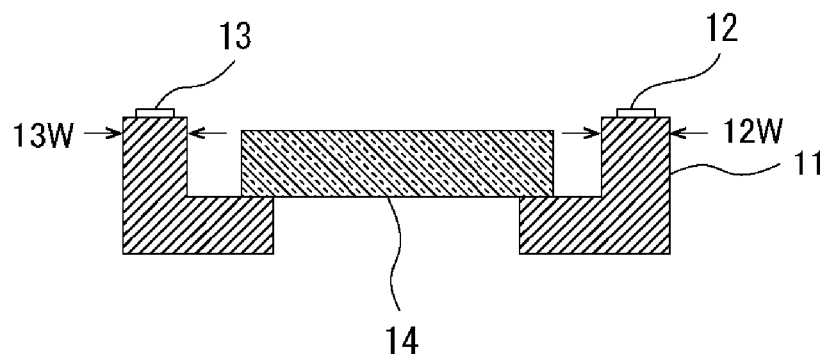
FIG. 2 is a cross-sectional view taken along a cutting line II-II shown in FIG. 1.

FIG. 1 is a plan view illustrating a mounting surface of a camera module, and FIG. 2 is a cross-sectional view taken along a cutting line II-II shown in FIG. 1. As shown in FIGS. 1 and 2, the camera module 10 includes a ceramic substrate 11 having a concave portion (cavity) in a rectangular mounting surface, a first terminal row 12 and a second terminal row 13 formed on two opposite sides of a peripheral edge of the concave portion on the rectangular mounting surface, and an image sensor 14 accommodated in the concave portion. In addition, in the cross section taken along the cutting line II-II, the camera module 10 has a mounting surface having a predetermined width 12W on which the first terminal row 12 is formed and a mounting surface having a predetermined width 13W on which the second terminal row 13 is formed.

Film Structure

Figure 3:
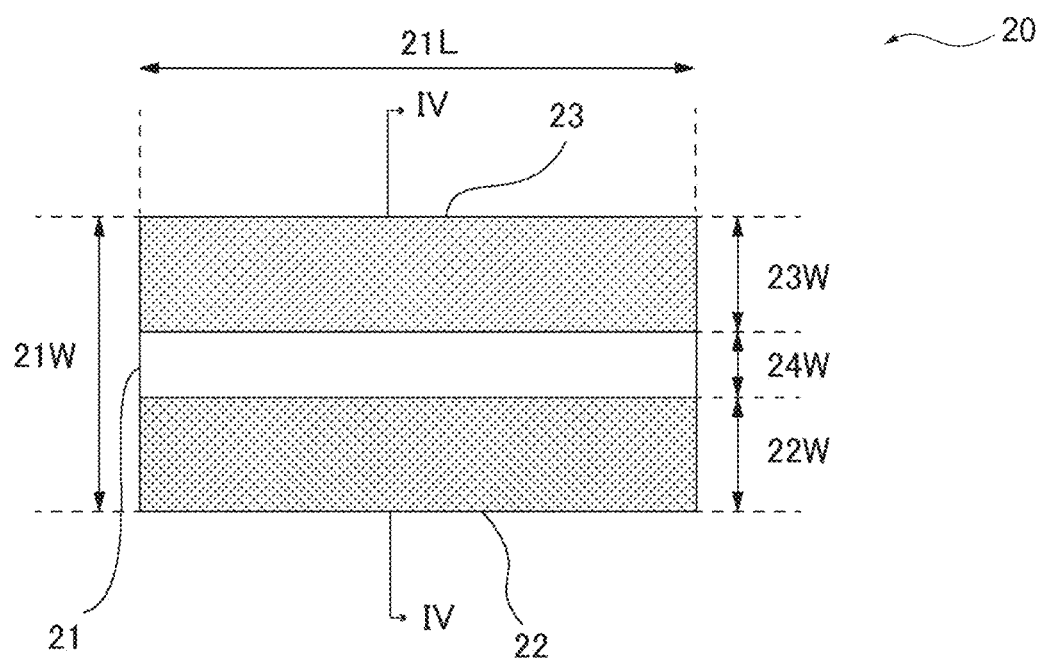
FIG. 3 is a plan view illustrating a unit region of a film structure.
Figure 4:
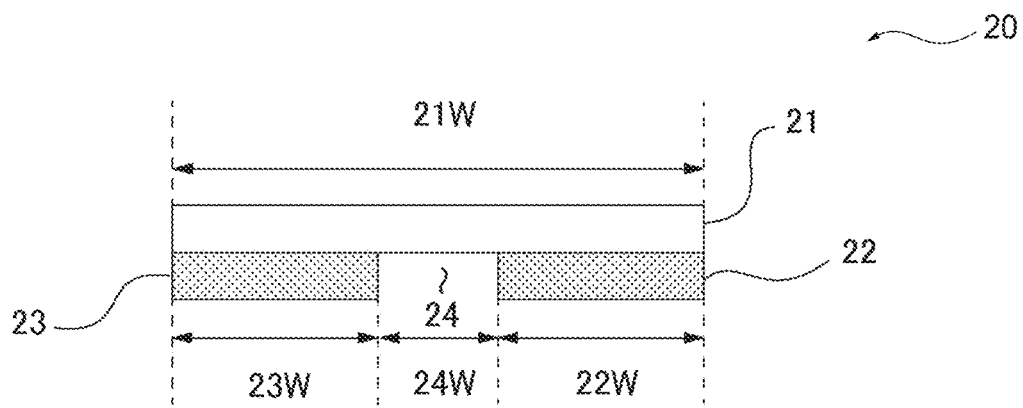
FIG. 4 is a cross-sectional view taken along a cutting line IV-IV shown in FIG. 3.

FIG. 3 is a plan view illustrating a unit region of the film structure, and FIG. 4 is a cross-sectional view taken along a cutting line IV-IV shown in FIG. 3. As shown in FIGS. 3 and 4, the film structure 20 has a tape-shaped base material 21 and connection films 22, 23 formed on the base material 21, and includes a rectangular unit region having a predetermined length 21L in the length direction of the base material 21 and a predetermined width 21W in the width direction of the base material 21 in plan view. The film structure 20 has a void 24 which is a non-pasting portion in the unit region, formed from the middle portion in the width direction and extended in the length direction of the base material 21 of the base material 21. The void 24 can be formed, for example, by punching an adhesive film in the length direction of the base material 21 from the middle portion in the width direction of the base material 21. That is, in the film structure 20, a non-pasting portion in the unit region is formed from the middle portion in the width direction of the base material and extended in the length direction of the base material, and the connection film 22 of the predetermined width 22W and the connection film 23 of the predetermined width 23W are formed in the length direction of the base material 21 separately so as to correspond with the first terminal row 12 and the second terminal row 13 of the ceramic substrate 11.

The width 22W of the connection film 22 and the width 23W of the connection film 23 may be narrower than, the same as, or wider than the width 12W of the mounting surface of the first terminal row 12 and the width 13W of the mounting surface of the second terminal row 13, respectively.

Setting the width of the connection film to be narrower than the width of the mounting surface of the terminal row can suppress excessive protrusion of the resin of the connection film from the film connection body. As a result, it is possible to avoid contact of the excessively protruded resin with the camera module and other mounted components, thereby improving the workability of assembly. This is also effective when it is preferable to avoid contamination of the mounting parts. Setting the width of the connection film to be wider than the width of the mounting surface of the terminal row can secure a sufficient amount of resin with respect to the connection portion, thereby improving the peel strength (connection strength) of the connection object. This is effective when it is desired to secure sufficient connection strength of the connection structure. By setting the width of the connection film to be equal to the width of the mounting surface of the terminal row, the above two advantages can be combined. The width of the connection film and the width of the mounting surface of the terminal row may be appropriately adjusted in accordance with specifications required for the mounting portion.

From the viewpoint of the conduction property and the adhesive property of the connection structure, the lower limits of the width 22W of the connection film 22 and the width 23W of the connection film 23 are preferably 80% or more, more preferably 100% or more, and still more preferably 120% or more of the width 12W of the mounting surface of the first terminal row 12 and the width 13W of the mounting surface of the second terminal row 13, respectively. From the viewpoint of shape forming, since the degree of difficulty increases when the width is too narrow, for example, the width is 0.3 mm or more, preferably 0.4 mm or more, and more preferably 0.5 mm or more. The upper limits of the width 22W of the connection film 22 and the width 23W of the connection film 23 are preferably 280% or less, and more preferably 240% or less of the width 12W of the mounting surface of the first terminal row 12 and the width 13W of the mounting surface of the second terminal row 13, respectively.

The lower limit of the width 24W of the void 24 is 5% or more, preferably 10% or more, and more preferably 20% or more relative to the width 21W of the base material 21, and the upper limit of the width 24W of the void 24 is 80% or less, preferably 75% or less, and more preferably 60% or less relative to the width 21W of the base material 21. If the width 24W of the void 24 is too narrow, there arises a concern that the concave portion might be sealed due to resin flow, and if the width 24W of the void 24 is too large, since the width of the connection film become narrow, there arises a concern that the connection film might be detached from the base material and, in some cases, the bonding strength of the connecting body might be insufficient. As a specific example, the width 24W of the void 24 is preferably 1.0 mm or more, and more preferably 1.2 mm or more. This can prevent reduction in reliability due to the filling of gas in the concave portion and increase the adhesive strength. Further, since the amount of the connection film used is reduced, this is preferable from the viewpoint of environmental issues. In addition to environmental issues, reuse of the material removed form the voids also reduces material costs and improves economical efficiency. Furthermore, the removed material in order to form the voids may be stored for verification.

Pasting Step

Figure 5:
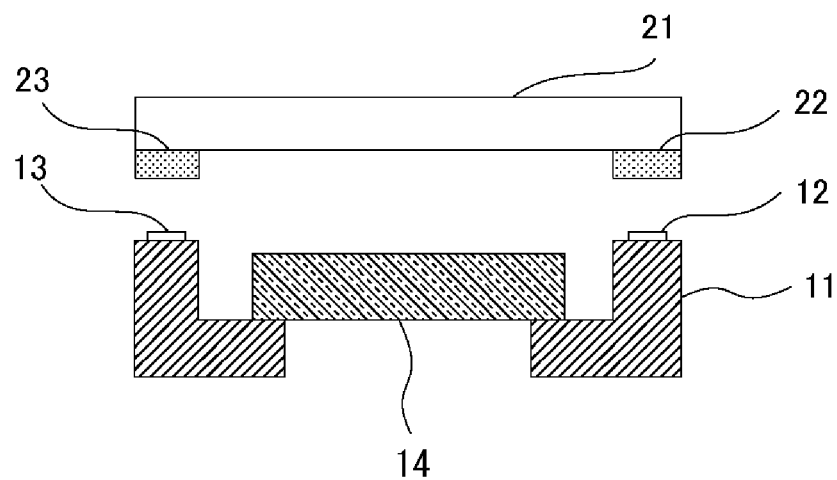
FIG. 5 is a cross-sectional view illustrating a pasting step of pasting a connection film to a camera module.
Figure 6:
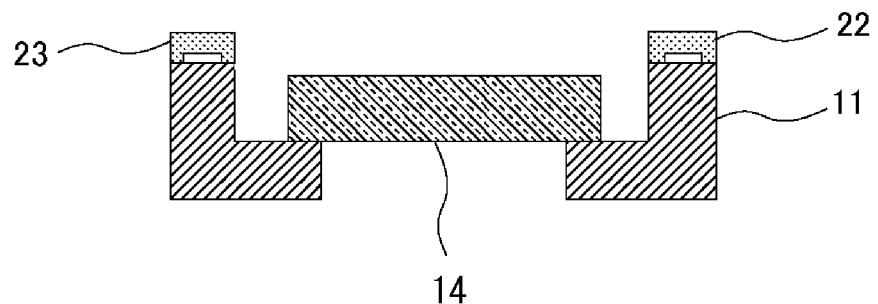
FIG. 6 is a cross-sectional view illustrating a state in which a base material is peeled off from a connection film in the pasting step.

FIG. 5 is a cross-sectional view illustrating a pasting step of pasting a connection film to a camera module, and FIG. 6 is a cross-sectional view illustrating a state in which a base material is peeled off from a connection film in the pasting step. As shown in FIGS. 5 and 6, in the pasting step, the connection films 22, 23 in the unit region of the film structure 20 are transferred to the camera module 10. For example, by using a pasting device, the connection films 22, 23 in the unit region are pressed from the base material side of the film structure and simultaneously pasted on the mounting surfaces of the camera module 10 placed on a stage. The film structure from which the connection films 22, 23 are transferred is wound away as a base material only.

Mounting Step

Figure 7:
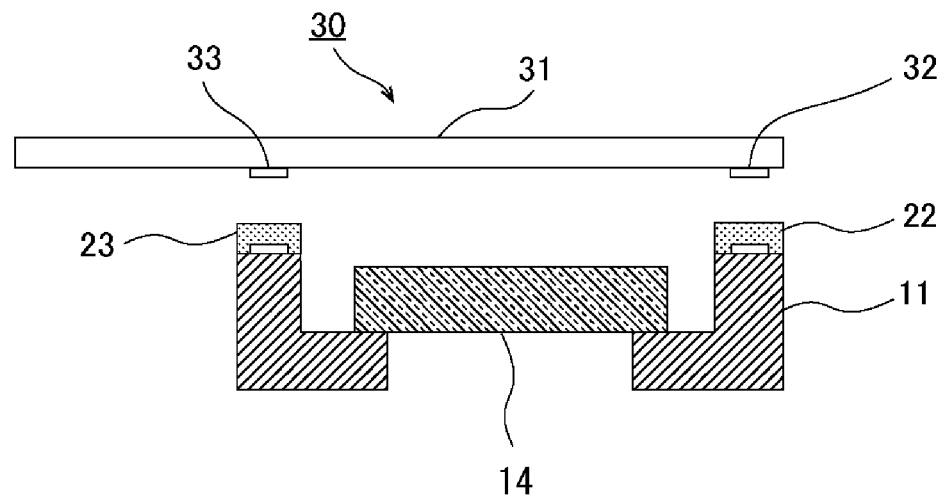
FIG. 7 is a cross-sectional view illustrating a mounting step of mounting a flexible substrate onto a camera module.

FIG. 7 is a cross-sectional view illustrating a mounting step of mounting a flexible substrate onto the camera module. As shown in FIG. 7, the flexible substrate 30 has a first terminal row 32 and a second terminal row 33 on a base material 31 corresponding to the first terminal row 12 and the second terminal row 13 of the camera module 10. In the mounting step, the first terminal row 32 and the second terminal row 33 of the flexible substrate 30 are aligned with the first terminal row 12 and the second terminal row 13 of the camera module 10, and the flexible substrate 30 is mounted onto the camera module 10.

Connecting Step

Figure 8:
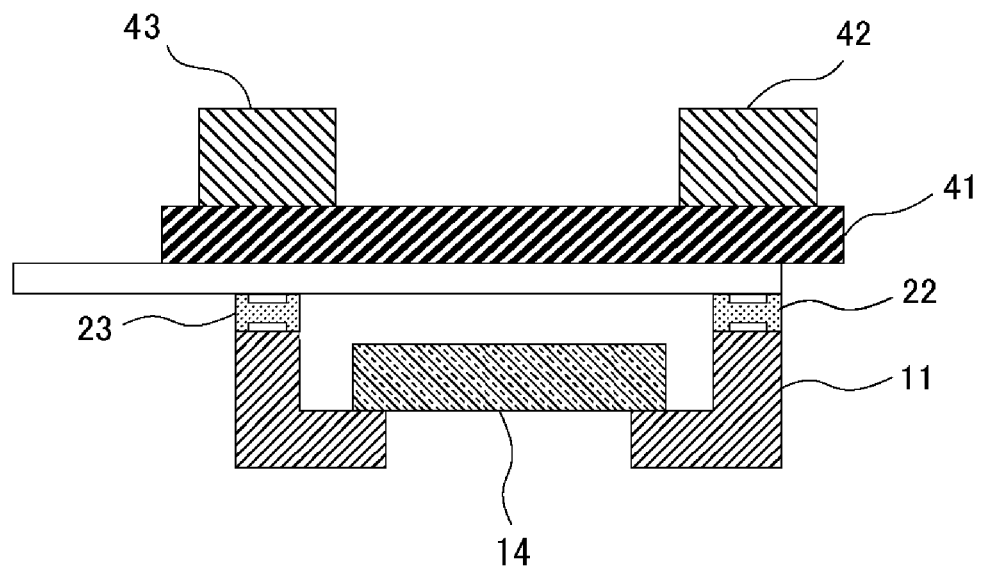
FIG. 8 is a cross-sectional view illustrating a connecting step of connecting terminals of a camera module and terminals of a flexible substrate via a connection film.

FIG. 8 is a cross-sectional view illustrating a connecting step of connecting terminals of the camera module and terminals of the flexible substrate via a connection film. As shown in FIG. 8, in the connecting step, for example, via a buffer material 41, the first terminal row 12 of the camera module 10 and the first terminal row 32 of the flexible substrate 31 are pressed together by the crimping tool 42, and the second terminal row 13 of the camera module 10 and the second terminal row 33 of the flexible substrate 30 are pressed together by the crimping tool 43. Further, according to the curing type of the connection film, heating, light irradiation, or the like is performed to cure the connection film.

Figure 9:
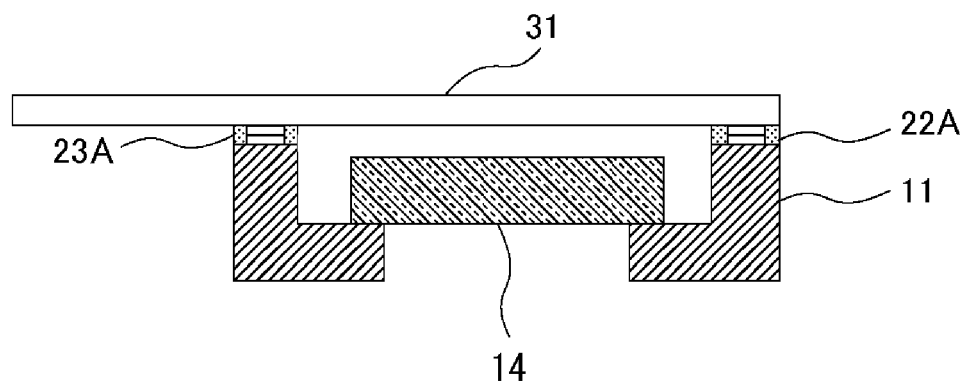
FIG. 9 is a cross-sectional view illustrating a connection structure with a camera module mounted thereon.

FIG. 9 is a cross-sectional view illustrating a connection structure with a camera module mounted thereon. As shown in FIG. 9, in the connection structure in which the camera module 10 is mounted, the first terminal row 12 of the camera module 10 and the first terminal row 32 of the flexible substrate 30 are connected via a cured film 22A formed by curing the connection film 22. The second terminal row 13 of the camera module 10 and the second terminal row 33 of the flexible substrate 30 are connected via a cured film 23A formed by curing the connection film 23. In the case of a hot-melt type connection film, the cured film 23 is a cured film of the hot-melt type connection film.

According to this method of manufacturing the connection structure, since the film structure has the non-pasting portion in a direction from a peripheral edge portion of the unit region to a central portion of the unit region in plan view, the electronic component having a concave portion in a central portion of the mounting surface can be mounted using existing equipment, and it is possible to prevent the concave portion from being filled with gas to reduce the reliability.

2. Connection Structure

A connection structure according to the present embodiment includes: a first electronic component having a concave portion in a central portion of a mounting surface; a second electronic component; and a cured film provided between the first electronic component and the second electronic component and formed by curing a connection film including, in a unit region having a predetermined length and a predetermined width in plan view, a non-pasting portion in a direction from a peripheral edge of the unit region to a central portion of the unit region, wherein terminals of the first electronic component and terminals of the second electronic component are connected. As a result, it is possible to prevent the gas from filling the concave portion to reduce the reliability.

As described above, the first electronic component and the second electronic component are not particularly limited and can be appropriately selected according to the purpose. There are no particular restrictions on the connection film and the curing type of the connection film, and these can be appropriately selected according to the purpose.

Figure 10:
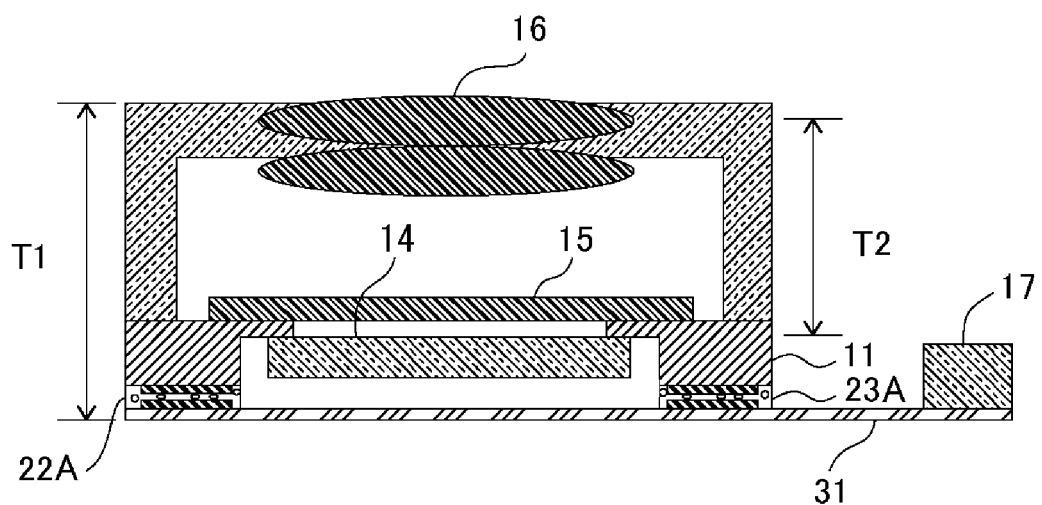
FIG. 10 is a cross-sectional view illustrating a configuration example of a connection structure with a camera module mounted thereon.

A connection structure having a camera module mounted thereon will be described below as a specific example. FIG. 10 is a cross-sectional view illustrating a configuration example of a connection structure with a camera module mounted thereon. The same parts as those shown in FIGS. 1 to 9 are denoted by the same reference numerals, and description thereof is omitted. As shown in FIG. 10, the connection structure includes: a camera module 10 having a first terminal row 12 and a second terminal row 13; a flexible substrate 30 having a first terminal row 32 and a second terminal row 33; a cured film 22A provided between the first terminal row 12 and the first terminal row 32 and formed by curing a connection film 22; and a cured film 23A provided between the second terminal row 13 and the second terminal row 33 and formed by curing the connection film 23. The connection structure has a protective glass 15 fixed on the ceramic substrate 11 and a lens 16 arranged above the image sensor 14 and fitted in a housing. A camera module driving IC 17 may be mounted on the flexible substrate 30 outside the camera module mounting portion.

According to the connection structure having such a structure, although it is difficult to reduce the optical distance T2 between the image sensor 14 and the lens 16, it is possible to reduce the distance T1 between the lens 16 and the flexible substrate 30, thereby making it possible to reduce the entire thickness. In the rectangular mounting surface of the connection structure, the two opposite sides of the peripheral edge of the concave portion of the ceramic substrate 11 are bonded by the cured film 22A and the cured film 23A, and parts of the other two sides are not bonded. Therefore, the concave portion of the ceramic substrate 11 is not sealed by the base material 31 of the flexible substrate 30, thereby preventing the flexible substrate 30 from swelling due to the influence of gas.

3. Film Structure

The film structure according to the present embodiment includes a tape-shaped base material and a connection film formed on the base material, and further includes a unit region of a predetermined length in the length direction of the base material and a non-pasting portion in a direction from a peripheral edge portion of the unit region to a central portion of the unit region. The film structure can be wound around a winding core to form a film winding body.

Figure 11:
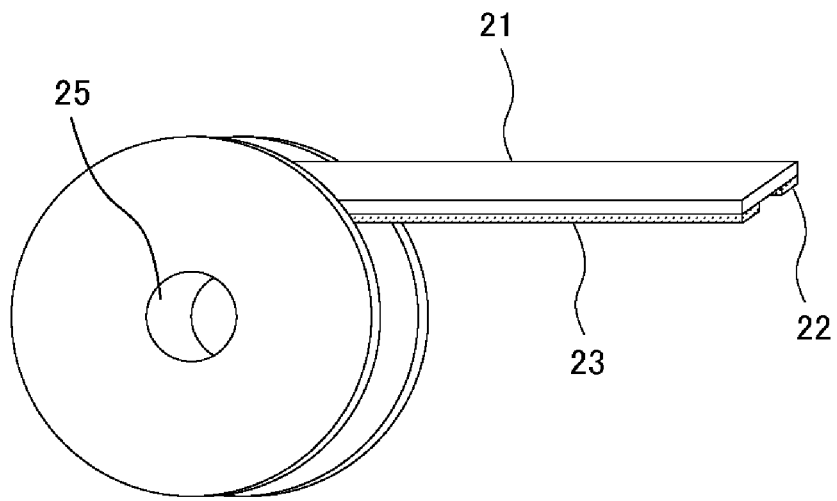
FIG. 11 is a perspective view illustrating a film winding body.

FIG. 11 is a perspective view schematically illustrating a film winding body. As shown in FIG. 11, the film winding body is formed by winding a film structure comprising a tape-shaped base material 21 and connection films 22, 23 formed on the base material 21 around a winding core 25. The winding core 25 has a shaft hole into which a rotary shaft for rotating a reel is inserted, and is connected to one end in the length direction of the film structure to wind the film structure. The length of the film structure wound on the film winding body is not particularly limited, but the lower limit of the length is preferably 5 m or more, 10 m or more, or 50 m or more, and the upper limit of the length is preferably 5,000 m or less, 3,000 m or less, or 1,000 m or less.

The base material 21 is a support film formed into a tape shape and supporting the connection films 22 and 24. Examples of the base material 21 include PET (polyethylene terephthalate), OPP (oriented polypropylene), PMP (poly-4-methylpentene-1), and PTFE (polytetrafluoroethylene), among others. Further, as the base material 21, for example, a material in which at least the surface on the side of the connection films 22, 23 is release treated with silicone resin can be suitably used.

The thickness of the base material is not particularly limited. The lower limit of the thickness of the base material is preferably 10 μm or more, more preferably 25 μm or more, and still more preferably 38 μm or more in consideration of separation. Because excessive pressure on the connection film may occur if the base material is too thick, the upper limit of the thickness of the base material is preferably 200 μm or less, more preferably 100 μm or less, and still more preferably 75 μm or less. This may be 50 μm or less. In addition, since the present technology assumes that the base material and the connection film can be separated, an excessively small unit region will cause unnecessary separation and thus undesirable. Also, an excessively large void portion is not preferable for the same reason.

The width of the base material is not particularly limited. The lower limit of the width of the base material is preferably 1 mm or more, more preferably 2 mm or more, and still more preferably 4 mm or more in consideration of winding. Because an excessively large base material might be difficult to carry and handle, the upper limit of the width of the base material may be 250 mm or less, preferably 120 mm or less, more preferably 60 mm or less, and still more preferably 10 mm or less. The width of the base material may be appropriately adjusted based on the sizes of the unit region and the void. From the viewpoint of productivity, it is preferable that a part of the connection film is in contact with the end of the width of the base film.

As described above, the connection film and the curing type of the connection film are not particularly limited and can be appropriately selected according to the purpose. As described above, the curing type may be replaced with a hot melt type.

In the following, an anisotropic conductive film containing conductive particles in an insulating binder will be described by way of example. The lower limit of the thickness of the anisotropic conductive film may be, for example, the same as the conductive particle diameter, and preferably, 1.3 times or more of the conductive particle diameter or 10 μm or more. The upper limit of the thickness of the anisotropic conductive film may be, for example, 40 μm or less or 2 times or less of the conductive particle diameter. In the anisotropic conductive film, an adhesive layer or a pressure sensitive adhesive layer containing no conductive particles may be laminated, and the number of layers and the laminated surface thereof can be appropriately selected according to the object and the purpose. The insulating resin of the adhesive layer or the pressure sensitive adhesive layer may be the same as that of the anisotropic conductive film. The conductive particles may be dispersed in the resin or arranged in a pattern. When the conductive particles are dispersed in the resin, these may be separated from each other without contact. The anisotropic conductive film preferably contains conductive particles so that the number of conductive particles to be trapped per terminal is preferably 5 or more, more preferably 10 or more.

As the conductive particles, those used in known anisotropic conductive films can be appropriately selected and used. Examples of the conductive particles includes metal particles such as nickel, copper, silver, gold, and palladium, and metal-coated resin particles in which the surfaces of resin particles such as polyamide and polybenzoguanamine are coated with a metal such as nickel. The surface may be insulated to such an extent that it does not interfere with the conduction performance. The surface may have projections.

Although the particle size of the conductive particles is not particularly limited, the lower limit of the particle size is preferably 2 µm or more, and the upper limit of the particle size is preferably, for example, 50 µm or less, more preferably 20 µm or less, from the viewpoint of the trapping efficiency of the conductive particles in the connection structure. The particle size of the conductive particles may be measured by an image type particle size distribution meter (for example, FPIA-3000: manufactured by Malvern). The number of the particles is 1,000 or more, preferably 2,000 or more.

As the insulating binder (insulating resin), a known insulating binder can be used. Examples of the curing type include a thermosetting type, a photo-curing type, and a photo-thermosetting type. Examples include a photoradical polymerization type resin composition containing a (meth) acrylate compound and a photoradical polymerization initiator, a thermal radical polymerization type resin composition containing a (meth) acrylate compound and a thermal radical polymerization initiator, a thermal cation polymerization type resin composition containing an epoxy compound and a thermal cation polymerization initiator, and a thermal anion polymerization type resin composition containing an epoxy compound and a thermal anion polymerization initiator. Known pressure sensitive adhesive compositions may also be used. In the case of a hot melt type, the composition disclosed in Japanese Unexamined Patent Application Publication No. 2014-060025 may be used.

In the following, as a specific example, a thermal radical polymerization type insulating binder containing a film forming resin, an elastomer, a (meth) acrylic monomer, a polymerization initiator, and a silane coupling agent will be described. It should be noted that the term "(meth) acrylic monomer" includes both of an acrylic monomer and a methacrylate monomer.

The film-forming resin is not particularly limited and includes, for example, a phenoxy resin, an unsaturated polyester resin, a saturated polyester resin, a urethane resin, a butadiene resin, a polyimide resin, a polyamide resin, and a polyolefin resin, among others. The film-forming resin may be used alone or in combination of two or more. Among these, it is particularly preferable to use a phenoxy resin from the viewpoints of film forming property, processability, and connection reliability. The phenoxy resin is a resin synthesized from bisphenol A and epichlorohydrin, and may be suitably synthesized or may be a product commercially available. The content of the film-forming resin is not particularly limited, and is preferably, for example, 10 to 60 mass %.

The elastomer is not particularly limited and includes, for example, a polyurethane resin (polyurethane elastomer), an acrylic rubber, a silicone rubber, and a butadiene rubber, among others.

The (meth) acrylic monomer is not particularly limited, and may be, for example, a monofunctional (meth) acrylic monomer or a bifunctional or multifunctional (meth) acrylic monomer. From the viewpoint of stress relaxation of the polymer, 80 mass % or more of (meth) acrylic monomers in the insulating binder are preferably monofunctional (meth) acrylic monomers.

From the viewpoint of adhesiveness, the monofunctional (meth) acrylic monomer preferably contains a carboxylic acid. The molecular weight of the monofunctional (meth) acrylic monomer having the carboxylic acid is preferably 100 to 500, more preferably 200 to 350. The content of the monofunctional (meth) acrylic monomer having the carboxylic acid in the insulating binder is preferably 3 to 20 mass %, more preferably 5 to 10 mass %.

The polymerization initiator is not particularly limited as long as it can cure the (meth) acrylic monomer at a predetermined temperature at the time of thermocompression bonding, and examples thereof include an organic peroxide. Examples of the organic peroxide include lauroyl peroxide, butyl peroxide, benzyl peroxide, dilauroyl peroxide, dibutyl peroxide, peroxydicarbonate, and benzoyl peroxide, among others. These may be used alone or in combination of two or more. The content of the polymerization initiator in the insulating binder is not particularly limited, and is preferably, for example, 0.5 to 15 mass %.

The silane coupling agent is not particularly limited and includes, for example, an epoxy-based silane coupling agent, an acrylic silane coupling agent, a thiol-based silane coupling agent, and an amine-based silane coupling agent, among others. The content of the silane coupling agent in the insulating binder is not particularly limited, and is preferably, for example, 0.1 to 5.0 mass %.

Method of Manufacturing Film Structure

The method of manufacturing a film structure includes a processing step of processing a film stock comprising a tape-shaped base material and a connection film formed on the base material, and the processing step includes forming a film structure which has a unit region of a predetermined length in the length direction of the base material and a predetermined width in the width direction of the base material in plan view and has a non-pasting portion in a direction from a peripheral edge portion of the unit region to a central portion of the unit region. In the processing step, a connection film having a desired shape is formed in a unit region by slitting, half-cutting, punching, or punch-pressing the film stock. Alternatively, only the connection film on the base material film may be processed and removed. Further, a step of providing a cover film on the surface of the connection film may be provided. Therefore, the base material and the connection film may be processed as described above using the cover film as a support (substitute for the base material). As described above, since the connection film are to be released (separated) from the base material during use, the degree of difficulty of the processing is high. The material of the cover film may be the same as that of the base material 21. The thickness thereof is preferably thinner than the base material 21.

For example, the film structure shown in FIGS. 3 and 4 can be formed by a processing step including performing a full cut to produce a unit region having a predetermined width in plan view, and performing a half cut to produce a non-pasting portion in a direction from a peripheral edge portion of the unit region to a central portion of the unit region. Specifically, the film structure can be formed by fully cutting the film stock at a width 21W in the unit region, half-cutting the film stock at a width 24W corresponding to the void 24, and punching out the connection film having a width 24W. Removing a part of the connection film from the film structure can allow a part of the resin of the connection film to move to the void which is a non-pasting portion to suppress protrusion and blocking which would occur when the film structure is made into a reel, thereby increasing the degree of freedom of formulation design of the connection film. Further, in the case of forming the film winding body after the processing, since the connection film and the processed portion come into contact with each other, a trace of processing is left on the connection film, which may be undesirable in appearance. To prevent this, a cover film may be provided.

The depth of the half cut is preferably 1% or more and 95% or less of the thickness of the base material. A deep half cut can suppress the protrusion and blocking because the resin of the protruding connection film enters the half cut part when formed as a reel. Since a shallow half cut might not penetrate through the connection film, the depth of the half cut is preferably 5% or more of the thickness of the base material. Although this also depends on the thickness of the base material, it is more preferably 10% or more in order to perform a stable half-cutting. When the viscosity of the adhesive film is high, this is preferably greater than 50%, more preferably 55% or more, and in some cases, more preferably 60% or more in order to obtain a reliable cut. Further, if the depth of the half cut is too deep, the base material might be penetrated by slight vibration or the like when continuously performing the half-cutting, so that the depth of the half cut is preferably 90% or less, more preferably 80% or less, still more preferably 50% or less, and in some cases, 25% or less of the thickness of the base material. This may be appropriately selected according to the thickness of the base material or the length of the film. In addition, since the connection film can be easily removed from the base material by such a half cut, the manufacturing productivity of the connection structure can be improved.

The processed film structure may be left with the connection film on one surface half-cut, or the connection film may be individually present on the base material by removing a part of the connection film. Although the connection film is preferably supported on the base material from a manufacturing view point, the base material may be removed by using the cover film as the support. This may be selected in consideration of overall workability and economical efficiency from the manufacturing process of the film structure to the connecting process using the film structure. Such a wide selectivity enhances convenience.

5. Modifications

Figure 12:
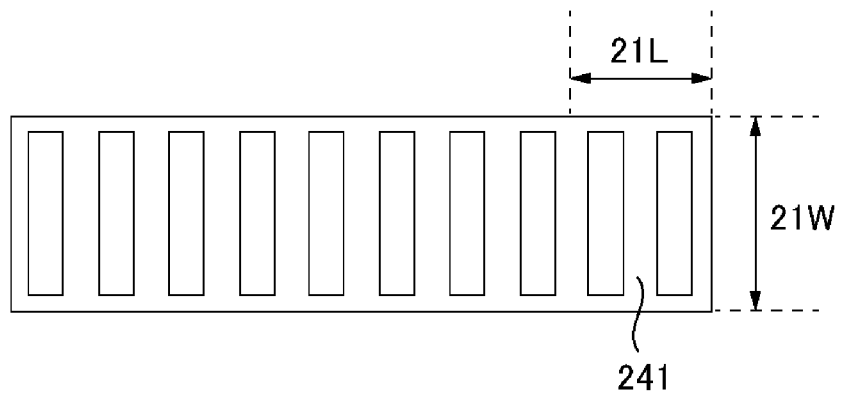
FIG. 12 is a plan view illustrating a film structure of Modification 1.

FIGS. 12 to 15 are plan views showing the film structures of Modifications 1 to 4, respectively. As shown in FIG. 12, the film structure of Modification 1 includes a void 241, which is a non-pasting portion, formed in a unit region from a middle portion of two sides in the length direction of the base material in the entire width direction of the base material, and can correspond to an electronic component in which a concave portion is formed in a central portion of a rectangular mounting surface and terminal rows are formed on two opposite sides of the peripheral edge of the concave portion.

Figure 13:
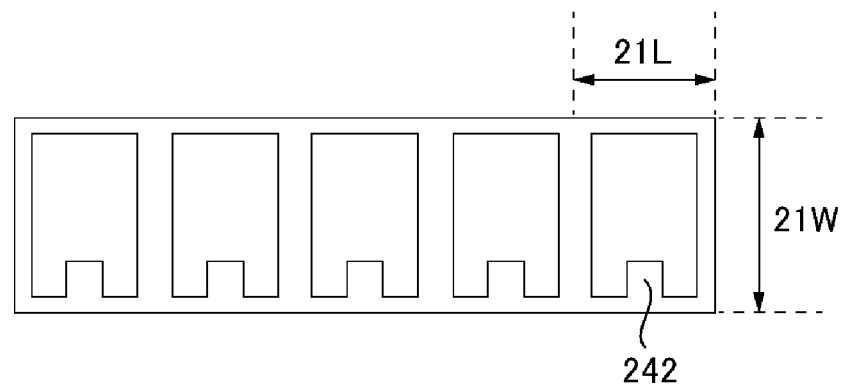
FIG. 13 is a plan view illustrating a film structure of Modification 2.

Further, as shown in FIG. 13, the film structure of Modification 2 includes a void 242, which is a non-pasting portion, formed in a unit region from a middle portion of one side in the length direction of the base material to a part in the width direction of the base material, and can correspond to an electronic component in which a concave portion is formed in a central portion of a rectangular mounting surface and terminal rows are formed on three sides of the peripheral edge of the concave portion.

Figure 14:
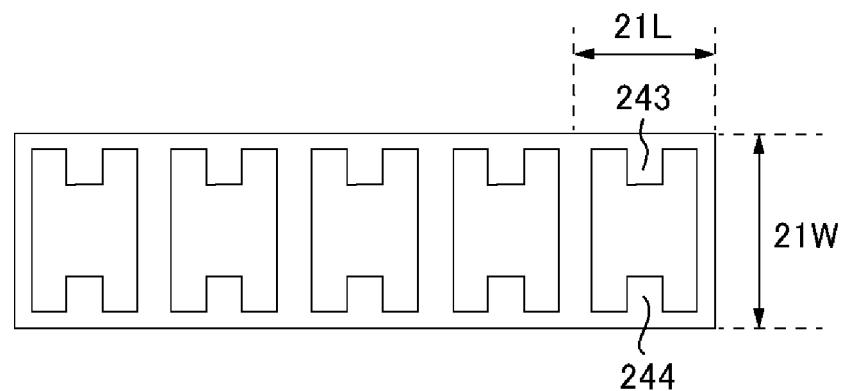
FIG. 14 is a plan view illustrating a film structure of Modification 3.

Further, as shown in FIG. 14, the film structure of Modification 3, includes voids 243 and 244, which are non-pasting portions, formed in a unit region from middle portions of two sides in the length direction of the base material to a part of the width direction of the base material, and can correspond to an electronic component in which a concave portion is formed in a central portion of a rectangular mounting surface and terminal rows are formed on two opposite sides of the peripheral edge of the concave portion.

These film structures of Modification 1 to 3 can be formed by a punching process, for example.

Figure 15:
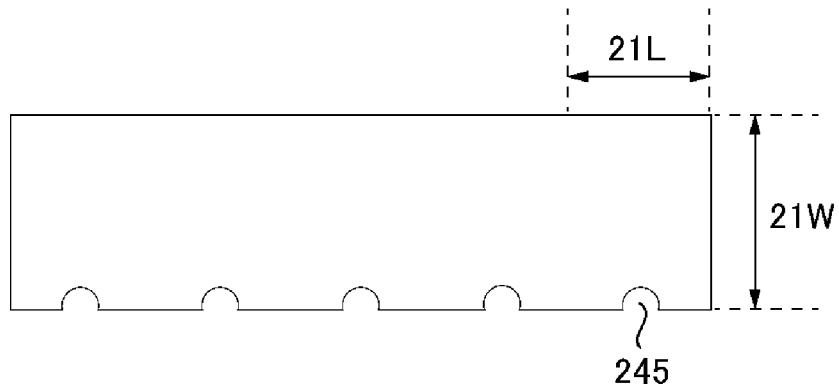
FIG. 15 is a plan view illustrating a film structure of Modification 4.

Further, as shown in FIG. 15, the film structure of Modification 4 includes a void 245, which is a non-pasting portion, formed in a unit region from a middle portion of one side in the length direction of the base material to a part in the width direction of the base material, and can correspond to an electronic component in which a concave portion is formed in a central portion of a rectangular mounting surface and terminal rows are formed on three sides of the peripheral edge of the concave portion. Further, the film structure of Modification 4 has a simple structure in which neither the base material nor the connection film exists in the non-pasting portion by, for example, punch-pressing process, and the connection film can be half-cut to a length of 21L of a unit region by an existing pasting device.

Figure 16:
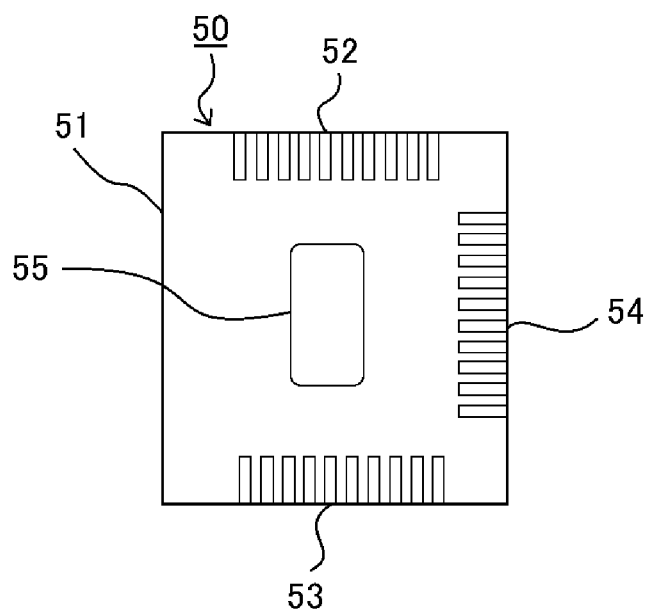
FIG. 16 is a plan view illustrating a mounting surface of another example of a camera module.

FIG. 16 is a plan view illustrating a mounting surface of a camera module. A camera module 50 shown in FIG. 16 includes: a ceramic substrate 51 having a concave portion (cavity) in a rectangular mounting surface; a first terminal row 52 and a second terminal row 53 formed on two opposite sides of a peripheral edge of the concave portion on the rectangular mounting surface; a third terminal row 54 formed on one of the two sides different from the two sides where the first terminal row 52 and the second terminal row 53 are formed; and an image sensor 55 accommodated in the concave portion. The mounting surface of the camera module 50 is rectangular, has a concave portion in a central portion, and has terminal rows on three sides (rectangular U-shaped) of the peripheral edge of the concave portion.

Figure 17:
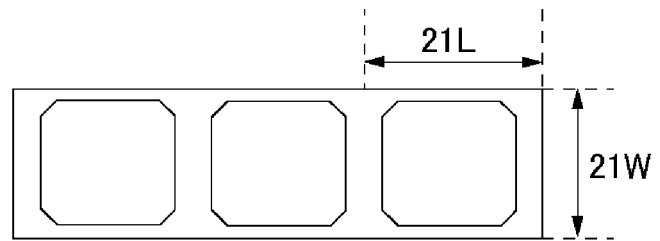
FIG. 17 is a plan view illustrating a first example of a film structure corresponding to the mounting surface shown in FIG. 16.

FIG. 17 is a plan view illustrating a first example of a film structure corresponding to the mounting surface shown in FIG. 16. In the film structure shown in FIG. 17, the peripheral edge of the pasting portion is octagonal in the unit region of 21L×21W. As a result, in the mounting of the electronic component having the rectangular mounting surface, as compared with the case where the shape of the peripheral edge of the pasting portion is rectangular, it is possible to suppress excessive protrusion of the resin after pressing, thereby preventing the side surface of the electronic component from being contaminated. Further, by chamfering the corners of the rectangular pasting portion with straight lines to form octagonal pasting portions, the amount of the connection film used can be reduced. A non-pasting portion may be provided in a central portion of the octagonal pasting portion. Thus, it is possible to prevent the concave portion of the camera module 50 from being sealed.

Figure 18:
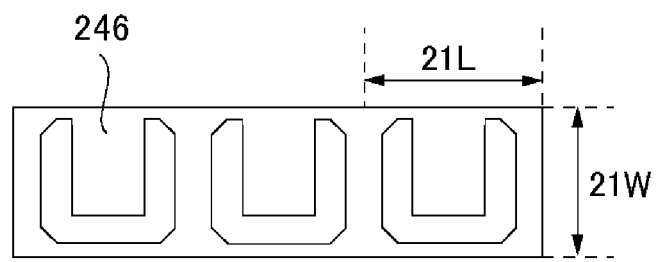
FIG. 18 is a plan view illustrating a second example of a film structure corresponding to the mounting surface shown in FIG. 16.

FIG. 18 is a plan view illustrating a second example of the film structure corresponding to the mounting surface shown in FIG. 16. The film structure shown in FIG. 18 is formed, in the octagonal pasting portion of the film structure shown in FIG. 17, by providing a void 246, which is a non-pasting portion, from a middle portion of one side in the length direction of the base material to a part in the width direction of the base material. Thus, in the mounting of the electronic component having the mounting surface shown in FIG. 16, it is possible to prevent the concave portion of the camera module 50 from being sealed, and it is also possible to reduce the amount of the connection film used. Further, since the outer shape of the mounting surface and the outer shape of the film structure coincide with each other at necessary portions, it is possible to suppress excessive protrusion of unnecessary resin after bonding of the connection film.

Figure 19:
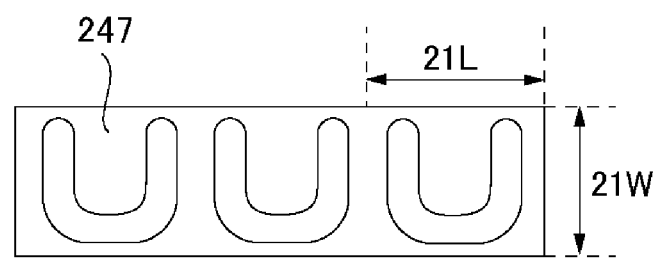
FIG. 19 is a plan view illustrating a third example of a film structure corresponding to the mounting surface shown in FIG. 16.

FIG. 19 is a plan view illustrating a third example of the film structure corresponding to the mounting surface shown in FIG. 16. In the film structure shown in FIG. 19, in the unit region of 21L×21W, the peripheral edge of the pasting portion has a curved U-shape corresponding to the mounting surface shown in FIG. 16. In this case, the corners of the rectangular pasting portion are processed with a curve, a void 247 which is a non-pasting portion is formed in a part in the width direction of the base material from a middled portion of one side in the length direction of the base material, and the corners are chamfered with a curve to form a curved U-shaped pasting portion. The curved shape of the pasting portion reduces the sharp portion, so that it is possible to prevent the connection film from being turned up due to unnecessary contact.

The film structures shown as the first to third examples can be obtained, for example, by preparing a master disk equipped with a blade for cutting a base film (for example, polyethylene terephthalate) which is a base material, and a half-cut blade which reaches a depth of about a half of the thickness of the base material to cut the connection film into each shape, punching out the original film using the master disk, and removing the non-pasting portion. The master disk may have a connecting part. In this case, in the length direction of the film structure, although intervals between the pasting portions of the connection film might be changed, it is advantageous in terms of manufacturing management such as number counting.

A method of manufacturing a connection structure according to another embodiment includes: a pasting step of pasting, from a film structure comprising a tape-shaped base material, a connection film formed on the base material, and a cover film pasted on the connection film, a connection film having a unit region of a predetermined length in the length direction of the base material and a predetermined width in the width direction of the base material to a substrate component comprising an element and a plurality of electrodes formed around the element, or to an electronic component comprising electrodes corresponding to the plurality of electrodes of the substrate component; and a connecting step of connecting the electrodes of the substrate component and the electrodes of the electronic component via the connection film, and the film structure has a non-pasting portion made of the cover film at a portion corresponding to the element in the unit region. By making the non-pasting portion as the cover film, when the film structure is wound around a winding core to form a film winding body, it is possible to prevent appearance deterioration which might be caused when a processed base material or the like is brought into contact with a resin of an adhesive film and the shape of the base material or the like is imprinted. In addition, excessive protrusion of the resin into the void can be suppressed.

As the cover film, for example, PET, OPP, PMP, and PTFE, among others, can be used as with the base material. The thickness of the cover film is preferably thinner than the base material, preferably 8 to 38 μm, and more preferably 12 to 25 μm.

In the pasting step, the connection film is preferably aligned and pasted to a substrate component or an electronic component. This makes it possible to reliably prevent the adhesive film from adhering to the element.

The connection structure according to another embodiment includes: a substrate component comprising an element and a plurality of electrodes formed around the element; an electronic component comprising electrodes corresponding to the electrodes of the substrate component; and a cured film provided between the substrate component and the electronic component and formed by curing a connection film having a void formed in a portion corresponding to the element in a unit region having a predetermined length and a predetermined width, and the electrodes of the substrate component and the electrodes of the electronic component are connected. By using a connection film in which a portion corresponding to the element is a void, it is possible to prevent the adhesive film from adhering to the element and the function of the element from deteriorating. Further, since the connection film can be temporarily pasted to the base material while avoiding the element, the working efficiency in the connecting step is improved. Since such an element is relatively expensive in many cases, it can be said that processing the connection film structure in advance is highly economical from a comprehensive viewpoint.

The substrate component and the electronic component are not particularly limited and can be appropriately selected according to the purpose. Examples of the substrate component include a ceramic substrate, a rigid substrate, a flexible printed circuit (FPC), a glass substrate, a plastic substrate, a resin multilayer substrate, an IC (integrated circuit) module, and an IC chip, among others. Examples of the electronic component include a ceramic substrate, a rigid substrate, a flexible printed circuit (FPC), a glass substrate, a plastic substrate, and a resin multilayer substrate, among others.

Further, the present technology can be applied to a substrate component in which a semiconductor element is provided in a central portion of a mounting surface and an electrode is formed at the peripheral edge of the mounting surface. For example, in the case of a substrate component having a semiconductor element in a central portion of a rectangular mounting surface, there are substrate components having electrodes on two opposing sides of the mounting surface, two adjacent sides (L-shape) of the mounting surface, three sides (rectangular U-shaped, curved U-shaped, C-shaped) of the peripheral edge of the mounting surface, and four sides or all sides (in the cases of polygons having five or more of sides). The connection film and the base material may be penetrated and punched out (an inner portion of the surface may be removed). The outer shape of the mounting surface may be not only a rectangular shape but also a curved shape, a circular shape, and a polygonal shape, among other shapes. In particular, a camera module in which an image sensor is mounted in a central portion of a ceramic substrate is preferable as a substrate component from the viewpoint of excellent electrical insulation and thermal insulation.

Figure 20:
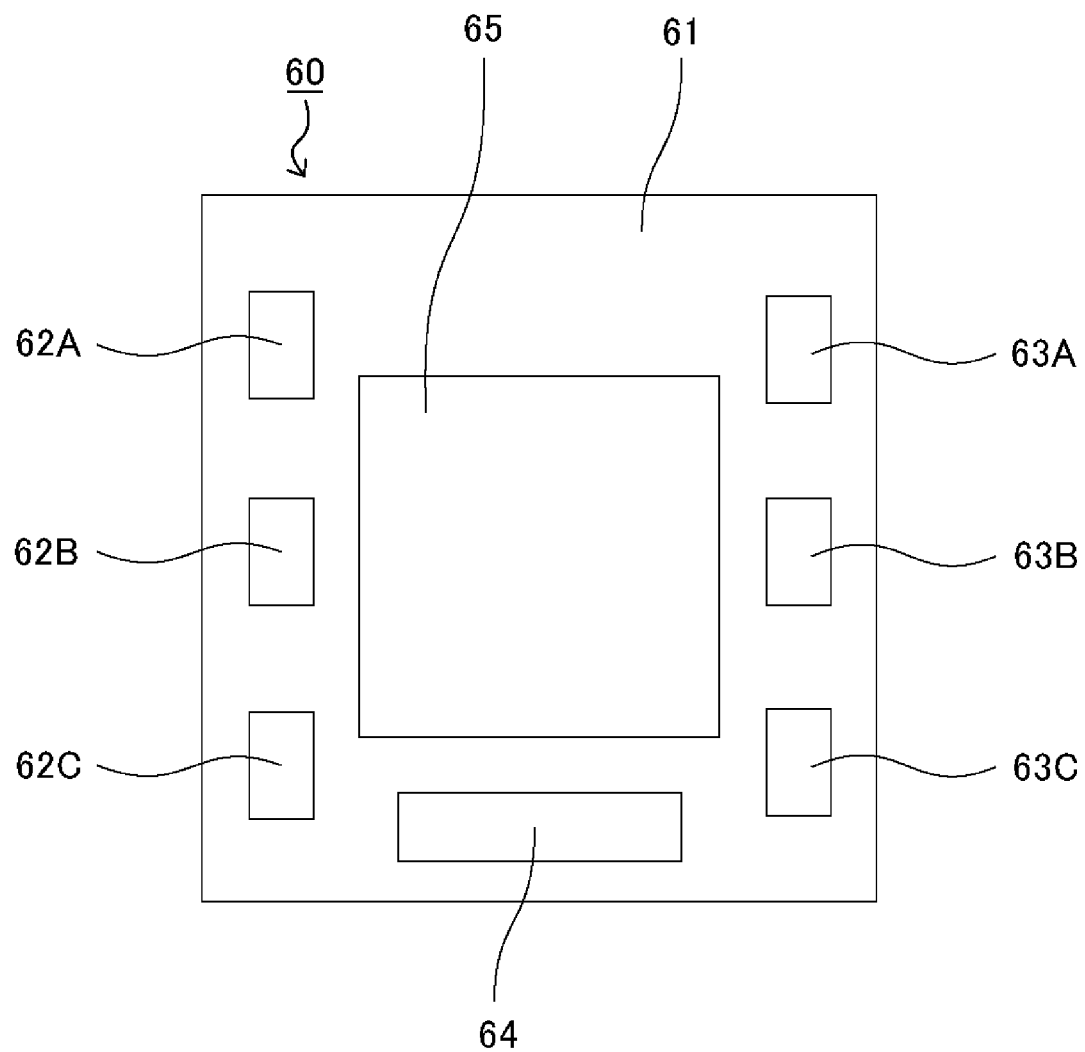
FIG. 20 is a plan view illustrating an example of a mounting surface of a camera module according to another embodiment.

FIG. 20 is a plan view illustrating an example of a mounting surface of a camera module according to another embodiment. A camera module 60 shown in FIG. 20 includes a ceramic substrate 61, first electrodes 62A, 62B, 62C and second electrodes 63A, 63B, 63C formed on two opposite sides of the peripheral edge of the image sensor 65, a third electrode 64 formed on one of two sides different from the two sides on which the first electrodes 62A, 62B, 62C and the second electrodes 63A, 63B, 63C are formed, and an image sensor 65 mounted on a central portion of the ceramic substrate 61. That is, the camera module 60 has the first to third electrodes on three sides (rectangular U-shaped) of the peripheral edge of the rectangular image sensor 65. It should be noted that the present technology is not limited to the mounting surface shown in FIG. 20, but may have electrodes on all four sides of the peripheral edge of the image sensor.

Figure 21:
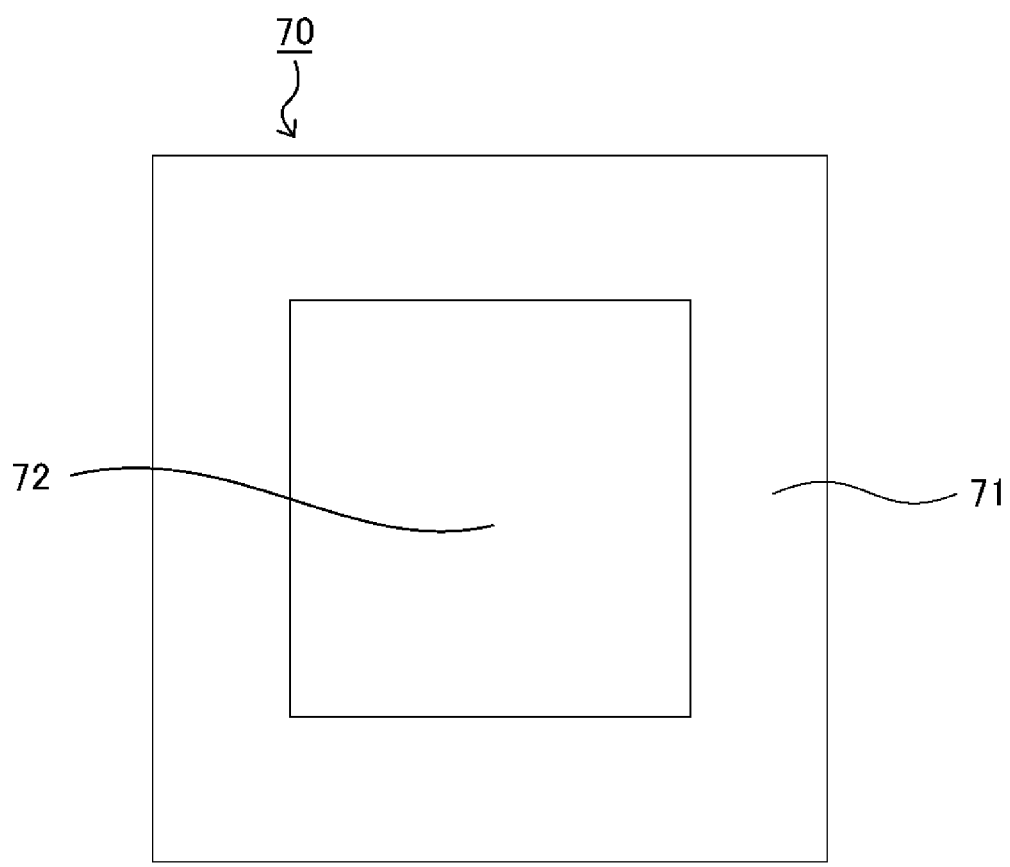
FIG. 21 is a plan view illustrating an example of a connection film corresponding to the mounting surface of the camera module shown in FIG. 20.

FIG. 21 is a plan view illustrating an example of the connection film corresponding to the mounting surface of the camera module shown in FIG. 20. The connection film 70 includes a pasting portion 71 consisting of four sides of the peripheral edge of the image sensor 65, and a non-pasting portion 72 which is a void formed by punching-out a portion corresponding to the image sensor 65. Since the portion corresponding to the image sensor 65 is a void, the connection film 40 can be prevented from adhering to the image sensor 65.

Figure 22:
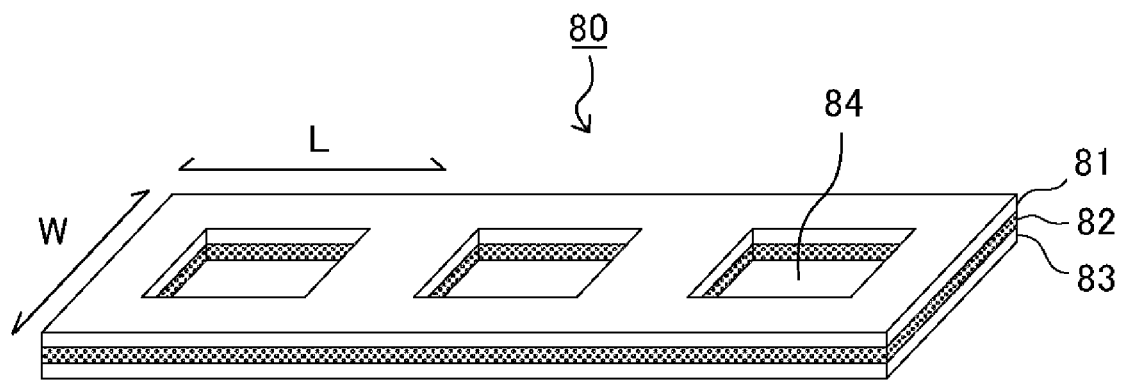
FIG. 22 is a perspective view illustrating an example of a tape-shaped film structure for winding the connection film shown in FIG. 21.
Figure 23:
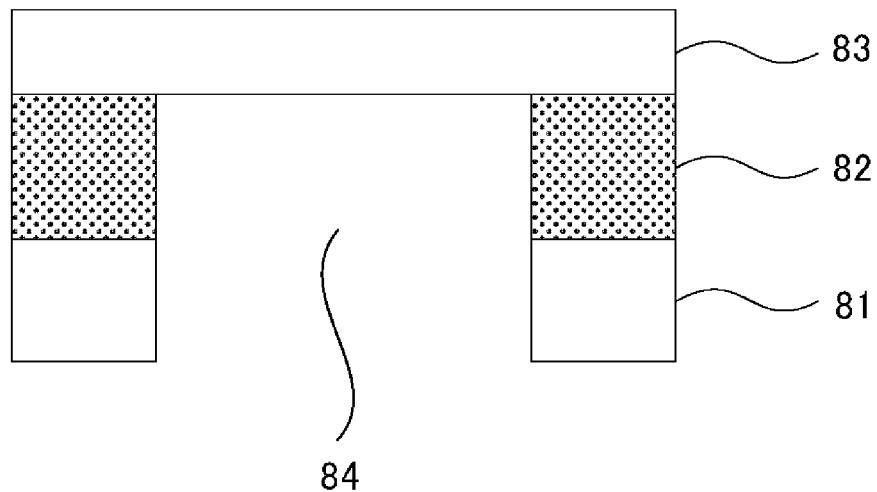
FIG. 23 is a cross-sectional view in the width direction of a film structure including a non-pasting portion.

FIG. 22 is a perspective view illustrating an example of a tape-shaped film structure for winding the connection film shown in FIG. 21, and FIG. 23 is a cross-sectional view in the width direction of a film structure including a non-pasting portion. The film structure 80 includes: a tape-shaped base material 81, a connection film 82 formed on the base material 81, and a cover film 83 pasted on the connection film 82, and further includes a rectangular unit region of a predetermined length L in the length direction of the base material 81 and a predetermined width W in the width direction of the base material 81, and a rectangular non-pasting portion 84 composed of the cover film 83 in a central portion of the unit region. By pasting the cover film 83, even if the resin of the connection film enters the non-pasting portion 84, the film structure can be easily drawn out from the winding body of the film structure. In addition, the appearance of the connection film can be maintained by pasting the cover film 83.

In the film structure shown in FIG. 22, a hollow portion in which the base material 81 and the connection film 82 are punched out is formed for each rectangular unit region having a predetermined length L and a predetermined width W. The cover film 83 shown in FIG. 22 is not penetrated, and the base material 81 and the connection film 82 are penetrated by punching. In this case, the connection film 82 may be half-cut or removed at every predetermined length L in accordance with the portions to be used. In the case of using the cover film as the support, the base material 81 and the connection film 82 may be half-cut or removed at every predetermined length L in accordance with the portions to be used. Further, it is also possible to form the shape of FIG. 21 in advance and paste it to the cover film.

The base material 81 and the cover film 83 are support films formed into a tape shape and supporting the connection film 82. As in the embodiment described above, examples of the base material 81 and the cover film 83 include PET (polyethylene terephthalate), OPP (oriented polypropylene), PMP (poly-4-methylpentene-1), and PTFE (polytetrafluoroethylene), among others. Further, as the base material 81 and the cover film 83, a material in which at least the surface on the side of the connection film 82 is release treated with silicone resin can be suitably used.

The connection film 81 is not particularly limited as in the above-described embodiment, and examples thereof include a film-shaped anisotropic conductive film (ACF) and a film-shaped adhesive non-conductive film (NCF). The curing type of the connection film 81 is not particularly limited, and examples thereof include a thermosetting type, a photo-curing type, and a photo-thermosetting type. The connection film 81 may be a hot melt type using a thermoplastic resin.

In the winding body, the film structure is wound around the core so that the cover film 83 is outside or inside. Such a film structure can be manufactured by a method including: a processing step of processing a film stock having a tape-shaped base material and a connection film formed on the base material; and a pasting step of pasting a cover film to the processed film stock, and the processing step includes punching out the base material and the connection film in a central portion in a unit region having a predetermined length in the length direction of the base material and a predetermined width in the width direction of the base material. If necessary, the film stock can be fully cut to a predetermined width of the unit region, and the film stock can be wound around the core by joining the cut pieces.

In the processing step, the predetermined length and the predetermined width in punching the base material and the connection film in a central portion of the unit region are, for example, 0.3 mm or more, preferably 0.4 mm or more, and more preferably 0.5 mm or more. When the punching size of the base material and the connection film is too small, the non-pasting portion might not be formed due to the protrusion of the resin of the connection film to the punched-out portion.

Further, in the present technology, an adhesive film is pasted to portions corresponding to terminal rows or electrodes, conductive particles may be provided only at the portions corresponding to the terminal rows and the electrodes. Examples of the technology to provide the conductive particles only at the portions corresponding to terminal rows and electrodes are disclosed in Japanese Unexamined Patent Application Publication No. 2016-119306 and Japanese Unexamined Patent Application Publication No. 2016-131152, for example.

For example, a connection film in which the conductive particles are arranged only at portions corresponding to terminal rows and electrodes can be formed by forming a resin mold in which concave portions are arranged in a lattice shape at positions corresponding to the terminal rows and electrodes, filling the concave portion of the resin mold with conductive particles, and transferring the conductive particles from the resin mold to the insulating resin film. The conductive particles in the connection film are preferably arranged such that, for example, the number of conductive particles to be trapped by one terminal or electrode is 5 or more, and more preferably, the number of conductive particles to be trapped by one terminal or electrode is 10 or more. An array of conductive particles can also be used as an alignment mark for the connection film.

EXAMPLES

6. Examples

Examples of the present technology will be described below. In these examples, connection structures were fabricated using anisotropic conductive films, and the conduction properties were evaluated.

Preparation of Anisotropic Conductive Film

A anisotropic conductive adhesive composition was prepared by introducing 5 parts by mass of resin core conductive particles (Ni (undercoat)/Au (surface) plating, resin core) having an average particle diameter of 20 μm and 95 parts by mass of an insulating binder composed of the following components into a planetary type stirring device (product name: Awatori Rentaro (ARE), manufactured by THINKY) and stirring them for 1 minute. Then, the anisotropic conductive adhesive composition was coated on a PET film having a thickness of 50 μm and dried in an oven at 80° C. for 5 minutes to form an adhesive layer composed of the anisotropic conductive adhesive composition on the PET film, thereby preparing an anisotropic conductive film having a width of 6.0 mm and a thickness of 25 μm. The ratio of the conductive particles to the insulating binder was adjusted so that five or more particles were to be trapped after connection.

The insulating binder was prepared by mixing 47 parts by mass of phenoxy resin (product name: YP-50, manufactured by NSCC Epoxy Manufacturing), 3 parts by mass of monofunctional monomer (product name: M-5300, manufactured by TOAGOSEI), 25 parts by mass of urethane resin (product name: UR-1400, manufactured by Toyobo), 15 parts by mass of rubber component (product name: SG80H, manufactured by Nagase ChemteX), 2 parts by mass of silane coupling agent (product name: A-187, manufactured by Momentive Performance Materials Japan), and 3 parts by mass of organic peroxide (product name: NiperBW, manufactured by Nichiyu Corporation), into a mixed solution of ethyl acetate and toluene so that the solid content was 50% by mass.

Preparation of Connection Structure

A connection structure was prepared by thermocompression-bonding, via an anisotropic conductive film, a camera module evaluation substrate (ceramic substrate, width of 6.0 mm, width of mounting surface of terminal row of 1.0 mm, 200 μm pitch, line:space=1:1, terminal thickness of 10 μm, Ni (undercoat)/Au (surface) plating, with cavity structure, terminal rows on two opposite sides) and an FPC (polyimide film, 200 μm pitch, line:space=1:1, terminal thickness of 12 μm, Ni (undercoat)/Au (surface) plating). Thermocompression bonding was carried out by pressing down the tool from the FPC side through a silicon rubber having a thickness of 200 μm under the conditions of a temperature of 120° C., a pressure of 1 MPa, and a time of 6 second. In practice, desirable particle trapping number at each terminal is five or more. In the connection structure manufactured as this example, by observing the indentations with a microscope from the FPC side, it was confirmed that the trapping number of conductive particles trapped by a terminal was five or more.

Evaluation of Conduction Property

The initial conduction resistance value of the connection structure was measured with four-terminal sensing using a digital multimeter (manufactured by Yokogawa Electric Corporation) by flowing a current of 1 mA. After a reliability evaluation test under the conditions of a temperature of 121° C., a humidity of 100%, and an atmospheric pressure of 2 atm, the conduction resistance values of the connection structure were measured (12 hours and 24 hours after the test). With regard to the conduction property, those in which the conduction resistance value after the reliability evaluation test was equivalent to the initial conduction resistance value (difference of 5% or less) were evaluated as "A", and those in which the conduction resistance value after the reliability evaluation test increased from the initial conduction resistance value (difference of more than 5%) were evaluated as "B". The conduction resistance values of 20 samples of the connection structure were measured (N=20) and evaluated using the sample with the highest conduction resistance value.

Evaluation of Adhesive Property

For the connection structure, a peeling test was performed on the FPC at a peeling speed of 50 mm/min by 90 degrees, and the force required for peeling was measured. The adhesive property were evaluated with the peel strength of Comparative Example 1 as 1. The peel strength of 20 samples (N=20) of the connection structure was measured and evaluated using the sample with the lowest peel strength.

Experimental Example 1

An anisotropic conductive film of 6.0 mm width was pasted to a camera module evaluation substrate to prepare a connection structure. The evaluation of the conduction property and the adhesive property of this connection structure is shown in Table 1.

Example 1

In the film structure shown in FIGS. 3 and 4, an anisotropic conductive film was prepared by half-cutting a PET film having a thickness of 50 μm to a depth of 20 μm (40% of the thickness of the base material) so that the width 22W of the connection film 22 was 0.8 mm, the width 23W of the connection film 23 was 0.8 mm, and the width 24W of the void 24 was 4.4 mm. The evaluation of the conduction property and the adhesive property of this connection structure is shown in Table 1.

Example 2

In the film structure shown in FIGS. 3 and 4, an anisotropic conductive film was prepared in the same manner as in Example 1 except that the width 22W of the connection film 22 was 1.2 mm, the width 23W of the connection film 23 was 1.2 mm, and the width 24W of the void 24 was 3.6 mm. The evaluation of the conduction property and the adhesive property of this connection structure is shown in Table 1.

Example 3

In the film structure shown in FIGS. 3 and 4, an anisotropic conductive film was prepared in the same manner as in Example 1 except that the width 22W of the connection film 22 was 2.4 mm, the width 23W of the connection film 23 was 2.4 mm, and the width 24W of the void 24 was 1.2 mm. The evaluation of the conduction property and the adhesive property of this connection structure is shown in Table 1.

Experimental Example 2

In the film structure shown in FIGS. 3 and 4, an anisotropic conductive film was prepared in the same manner as in Example 1 except that the width 22W of the connection film 22 was 2.88 mm, the width 23W of the connection film 23 was 2.6 mm, and the width 24W of the void 24 was 0.24 mm. The evaluation of the conduction property and the adhesive property of this connection structure is shown in Table 1.

TABLE 1

|  | Expt. 1 | Ex. 1 | Ex. 2 | Ex. 3 | Expt. 2 |
| --- | --- | --- | --- | --- | --- |
| Ratio of film width to width (1.0 mm) of terminal mounting surface [%] | — | 80 (0.8 mm) | 120 (1.2 mm) | 240 (2.4 mm) | 288 (2.88 mm) |
| Ratio of width of void to width (6.0 mm) of ceramic substrate [%] | 0 | 73.3 (4.4 mm) | 60 (3.6 mm) | 20 (1.2 mm) | 4 (0.24 mm) |
| Conduction property evaluation | B | A | A | A | B |
| Adhesive property evaluation | 1 | 0.8 | 1 | 1 | 1 |

As shown in Table 1, in Experimental Example 1 in which an anisotropic conductive film was pasted to the entire of the camera module evaluation substrate, the conduction resistance value increased after the reliability evaluation test. Also, in Experimental Example 2 in which the width of the void was set to 4% (0.24 mm) of the width of the camera module evaluation substrate, the conduction resistance value increased after the reliability evaluation test. In Experimental Example 2, it is considered that because the void width was narrow, the void was blocked by resin flow at the time of connection, and in the reliability evaluation test, the FPC swelled due to gas expansion, so that the resistance value increased. It should be noted that that there is no particular problem in the practical use even in the performance of the Experimental Example 1 and the Experimental Example 2.

On the contrary, in Examples 1 to 3 in which the width of the void was 5% or more and 75% or less of the width of the camera module evaluation substrate, the conduction resistance value after the reliability evaluation test was equivalent to the initial conduction resistance value. Further, in Examples 2 and 3 in which the width of the anisotropic conductive film was set to 100% or more and 250% or less of the width of the mounting surface of the terminal row, the peeling strength was 1, as in Experimental Example 1.

Further, by using an anisotropic conductive film with an pasting portion having a shape as shown in FIG. 18, a connection structure was prepared by thermocompression-bonding a camera module evaluation substrate (ceramic substrate, width of 6.0 mm, width of mounting surface of first to third terminal rows of 1.0 mm, 200 μm pitch, line:space=1:1, terminal thickness of 10 μm, Ni (undercoat)/Au (surface) plating, with cavity structure, terminal rows on each side of rectangular U shape) having terminal rows in a rectangular U-shape as shown in FIG. 16 and an FPC (polyimide film, 200 μm pitch, line:space=1:1, terminal thickness of 12 μm, Ni (undercoat)/Au (surface) plating). The composition of the anisotropic conductive film was the same as described above, and the ratio of the maximum film width to the width (1.0 mm) of the terminal rows on the mounting surfaces of the first to third terminal rows was 100% (1.0 mm). Here, the film width is the width from the void side to the outside in the pasting portion of the shape shown in FIG. 18. The conduction property and the adhesive property of the connection structure were evaluated in the manner described above, and as in Example 2, the conduction property was A and the adhesive property was 1.

Further, by using an anisotropic conductive film having an pasting portion having a shape as shown in FIG. 17, a connection structure was prepared by thermocompression-bonding a camera module evaluation substrate (ceramic substrate, width of 6.0 mm, width of mounting surface of first to third terminal rows of 1.0 mm, 200 μm pitch, line:space=1:1, terminal thickness of 10 μm, Ni (undercoat)/Au (surface) plating, with cavity structure, terminal rows on each side of rectangular U shape) having terminal rows in a rectangular U-shape as shown in FIG. 16 and an FPC (polyimide film, 200 μm pitch, line:space=1:1, terminal thickness of 12 μm, Ni (undercoat)/Au (surface) plating).

This anisotropic conductive film had chamfered corners in the unit region of 21L×21W so that the shape of the peripheral edge of the pasting portion was octagonal, and the length 21L and the width 21W of the pasting portion were the same as the length and width of the camera module evaluation substrate, respectively. That is, in the anisotropic conductive film, portions corresponding to corners of the evaluation substrate were chamfered. The conduction property and the adhesive property of the connection structure were evaluated in the same manner as described above, and the results were similar to those of Experimental Example 1. There were no practical problems with the performance, and the excessive protrusion of the resin after the connection was suppressed, and the handleability was excellent.

The base material and the anisotropic conductive film were punched out in a square shape as in FIG. 21 (the connection film and the base material were removed) so that each of the four sides had widths of 0.8 mm, 1.2 mm, and 2.4 mm (as in Examples 1 to 3). As a cover film, a film structure having a width of 6.0 mm was prepared, in which a PET film having a thickness of 12 μm was provided. By using this film structure, a connection structure was prepared by thermocompression-bonding a camera module evaluation substrate (ceramic substrate, width of 6.0 mm, width of mounting surface of first to third terminal rows of 1.0 mm, 200 μm pitch, line:space=1:1, terminal thickness of 10 μm, Ni (undercoat)/Au (surface) plating, without cavity structure, terminal rows on each side of rectangular U shape) and an FPC (polyimide film, 200 μm pitch, line:space=1:1, terminal thickness of 12 μm, Ni (undercoat)/Au (surface) plating). The conduction property and the adhesive property of the connection structure were evaluated in the same manner as described above, and the conduction properties of all of the anisotropic conductive films having a width of 0.8 mm, 1.2 mm, and 2.4 mm on each of the four sides were evaluated as A and all of the results were same as Examples 1 to 3. The adhesive properties were all the same as those of Examples 1 to 3. As is the above, the evaluation results had no problem in practical use. In addition, since the base material and the anisotropic conductive film are punched in accordance with the outer shape of the substrate, the bonding to the ceramic substrate was easy to perform while manually aligning them. It is expected to be more efficient when done mechanically.

In addition, with regard to the above three types of samples, after ten or more layers were manually wound around a 150 mm diameter core without providing a cover film on a punched anisotropic conductive film, the film was drawn out, and at least 10 optional positions were visually confirmed. In all of the above three samples, the surface of the connection film was left with traces of punching. When the cover film was provided and evaluated in the same manner, there was no trace of punching on the surface of the connection film. If the appearance is deteriorated, the cause of the defect becomes unclear when the anisotropic connection is continuously performed, and it is revealed that the cover film is preferably provided in order to avoid this problem.

DESCRIPTION OF REFERENCE CHARACTERS 10 camera module, 11 ceramic substrate, 12 first terminal row, 13 second terminal row, 14 image sensor, 15 protective glass, 16 lens, 17 camera module driving IC, 20 film structure, 21 base material, 22 connection film, 23 connection film, 24 void, 30 flexible substrate, 31 base material, 32 first terminal row, 33 second terminal row, 41 buffer material, 42 crimping tool, 43 crimping tool, 50 camera module, 51 ceramic substrate, 52 first terminal row, 53 second terminal row, 54 third terminal row, 55 image sensor, 60 camera module, 61 ceramic substrate, 62A to 62C first electrode, 63A to 63C second electrode, 64 third electrode, 65 image sensor, 70 connection film, 71 pasting portion, 72 non-pasting portion, 80 film structure, 81 base material, 82 connection film, 83 cover film, 84 non-pasting portion

What is claimed is:

1. A method of manufacturing a connection structure, comprising:
   a pasting step of pasting, from a film structure comprising a tape-shaped base material and a connection film formed on the tape-shaped base material, the connection film having a unit region of a predetermined length in the length direction of the tape-shaped base material and a predetermined width in the width direction of the tape-shaped base material to a first electronic component or a second electronic component having a plurality of terminal rows; and
   a connecting step of connecting terminals of the first electronic component and terminals of the second electronic component through the connection film,
   wherein the film structure includes, in the unit region, in addition to portions corresponding to the plurality of terminal rows, a non-pasting portion in which the connection film is not pasted,
   wherein the first electronic component has a concave portion in a central portion of a mounting surface, and
   wherein the film structure has the non-pasting portion in a direction from a peripheral edge portion of the unit region to a central portion of the unit region.

2. The method of manufacturing a connection structure according to claim 1,
   wherein the unit region is rectangular, and
   wherein the non-pasting portion is formed in a direction from a middle portion of at least one side of the unit region to a central portion of the unit region.

3. The method of manufacturing a connection structure according to claim 1,
   wherein the unit region is rectangular, and
   wherein the non-pasting portion in the unit region is formed from a middle portion in the width direction of the tape-shaped base material and extended in the length direction of the tape-shaped base material.

4. The method of manufacturing a connection structure according to claim 1,
   wherein the first electronic component has a rectangular mounting surface, and
   wherein the mounting surface has terminal rows on two opposite sides of the peripheral edge of the concave portion, two adjacent sides of the peripheral edge of the concave portion, or three sides of the peripheral edge of the concave portion.

5. The method of manufacturing a connection structure according to claim 1, wherein the non-pasting portion is a void.

6. The method of manufacturing a connection structure according to claim 1,
   wherein the tape-shaped base material is half-cut into the shape of the non-pasting portion, and
   wherein the depth of the half cut is 1% or more and 95% or less of the thickness of the tape-shaped base material.

7. The method of manufacturing a connection structure according to claim 1,
   wherein the non-pasting portion is formed by punching out the tape-shaped base material and the connection film in a central portion of the unit region.

8. The method of manufacturing a connection structure according to claim 1,
   wherein the connection film is an anisotropic conductive film.

9. The method of manufacturing a connection structure according to claim 1,
   wherein the first electronic component is a camera module.

10. A connection structure, comprising:
    a first electronic component having a plurality of terminal rows;
    a second electronic component; and
    a cured film provided between the first electronic component and the second electronic component and formed by curing a connection film including, in a unit region having a predetermined length and a predetermined width in plan view, a void portion in addition to portions corresponding to the plurality of terminal rows,
    wherein terminals of the first electronic component and terminals of the second electronic component are connected,
    wherein the first electronic component has a concave portion in a central portion of a mounting surface, and
    wherein the connection film has the void portion in a direction from a peripheral edge portion of the unit region to a central portion of the unit region.

11. A film structure, comprising:
    a tape-shaped base material; and
    a connection film formed on the tape-shaped base material,
    wherein the connection film further includes a unit region of a predetermined length in the length direction of the tape-shaped base material and a predetermined width in the width direction of the tape-shaped base material in plan view and a non-pasting portion in which the connection film is not pasted in a direction from a peripheral edge portion of the unit region to a central portion of the unit region.

12. The film structure according to claim 11, wherein the tape-shaped base material is half-cut into the shape of the non-pasting portion, and
wherein the depth of the half cut is 1% or more and 95% or less of the thickness of the tape-shaped base material.

13. The film structure according to claim 11, wherein the non-pasting portion is formed by punching out the tape-shaped base material and the connection film in a central portion of the unit region.

14. A film winding body in which the film structure according to claim 11 is wound around a winding core.

15. A connection structure, comprising:
a first electronic component having a concave portion in a central portion of a mounting surface;
a second electronic component; and
a cured film provided between the first electronic component and the second electronic component and formed by curing a connection film of the unit region of the film structure that has a tape-shaped base material; and a connection film formed on the tape-shaped base material, wherein the connection film further includes a unit region of a predetermined length in the length direction of the tape-shaped base material and a predetermined width in the width direction of the tape-shaped base material in plan view and a non-pasting portion in a direction from a peripheral edge portion of the unit region to a central portion of the unit region,
wherein terminals of the first electronic component and terminals of the second electronic component are connected.

16. A method of manufacturing a film structure, comprising:
a processing step of processing a film stock comprising a tape-shaped base material and a connection film formed on the tape-shaped base material,
wherein the processing step includes performing a full cut to produce a unit region having a predetermined width in plan view, performing a half cut to produce a non-pasting portion in a direction from a peripheral edge portion of the unit region to a central portion of the unit region, and forming a film structure which has a unit region of a predetermined length in the length direction of the tape-shaped base material and a predetermined width in the width direction of the tape-shaped base material in plan view and has a non-pasting portion in a direction from a peripheral edge portion of the unit region to a central portion of the unit region.

17. The method of manufacturing a film structure according to claim 16,
wherein the depth of the half cut is 1% or more and 95% or less of the thickness of the tape-shaped base material.

18. The method of manufacturing a film structure according to claim 16,
wherein the processing step includes punching out the tape-shaped base material and the connection film in a central portion of the unit region to form the non-pasting portion.

19. A method of manufacturing a connection structure, comprising:

a pasting step of pasting, from a film structure comprising a tape-shaped base material, a connection film formed on the tape-shaped base material, and a cover film pasted on the connection film, a connection film having a unit region of a predetermined length in the length direction of the tape-shaped base material and a predetermined width in the width direction of the tape-shaped base material to a substrate component comprising an element and a plurality of electrodes formed around the element, or to an electronic component comprising electrodes corresponding to the plurality of electrodes of the substrate component; and
a connecting step of connecting the electrodes of the substrate component and the electrodes of the electronic component via the connection film,
wherein the film structure has a non-pasting portion made of the cover film at a portion corresponding to the element in the unit region, and
wherein the non-pasting portion is formed by punching out the tape-shaped base material and the connection film in a central portion of the unit region.

20. The method of manufacturing a connection structure according to claim 19,
wherein the pasting step includes aligning and pasting the connection film to a substrate component or an electronic component.

21. A connection structure, comprising:
a substrate component comprising an element and a plurality of electrodes formed around the element;
an electronic component comprising electrodes corresponding to the electrodes of the substrate component; and
a cured film provided between the substrate component and the electronic component and formed by curing a connection film having a void formed by punching out in a portion corresponding to the element in a unit region having a predetermined length and a predetermined width,
wherein the electrodes of the substrate component and the electrodes of the electronic component are connected.

22. A film structure, comprising:
a tape-shaped base material;
a connection film formed on the tape-shaped base material; and
a cover film pasted on the connection film,
wherein the film structure further comprises a unit region having a predetermined length in the length direction of the tape-shaped base material and a predetermined width in the width direction of the tape-shaped base material, and a non-pasting portion made of the cover film in a central portion of the unit region, and
wherein the non-pasting portion is formed by punching out the tape-shaped base material and the connection film in a central portion of the unit region.

23. The film structure according to claim 22, wherein the unit region is rectangular, and
wherein the non-pasting portion is rectangular.

24. A winding body formed by winding the film structure according to claim 22.

25. A method of manufacturing a film structure, comprising:
a processing step of processing a film stock having a tape-shaped base material and a connection film formed on the tape-shaped base material; and
a pasting step of pasting a cover film to the processed film stock, wherein the processing step includes performing a full cut to produce a unit region having a predetermined width in plan view, and punching out or performing a half cut the tape-shaped base material and the connection film in a central portion in a unit region having a predetermined length in the length direction of the tape-shaped base material and a predetermined width in the width direction of the tape-shaped base material, and wherein the film structure has a non-pasting portion made of the cover film in a central portion of the unit region.

\* \* \* \* \*